(12) United States Patent
Matsuo

(10) Patent No.: US 12,140,644 B2
(45) Date of Patent: Nov. 12, 2024

(54) CAPACITOR INSPECTION METHOD AND INSPECTION APPARATUS USED FOR SAME

(71) Applicant: YURI HOLDINGS CO., LTD., Yurihonjo (JP)

(72) Inventor: Reijiro Matsuo, Yurihonjo (JP)

(73) Assignee: YURI HOLDINGS CO., LTD., Akita (JP)

( * ) Notice: Subject to any disclaimer, the term of this patent is extended or adjusted under 35 U.S.C. 154(b) by 0 days.

(21) Appl. No.: 18/704,183

(22) PCT Filed: Oct. 24, 2022

(86) PCT No.: PCT/JP2022/039539
§ 371 (c)(1),
(2) Date: Apr. 24, 2024

(87) PCT Pub. No.: WO2023/074627
PCT Pub. Date: May 4, 2023

(65) Prior Publication Data
US 2024/0329156 A1 Oct. 3, 2024

(30) Foreign Application Priority Data

Oct. 26, 2021 (JP) .................................. 2021-174290
May 24, 2022 (JP) .................................. 2022-084743

(51) Int. Cl.
*G01R 31/00* (2006.01)
*G01R 31/64* (2020.01)
*G01R 15/04* (2006.01)

(52) U.S. Cl.
CPC .............. *G01R 31/64* (2020.01); *G01R 15/04* (2013.01)

(58) Field of Classification Search
CPC ...... G01R 31/016; G01R 31/64; G01R 27/26; G01R 27/2605
See application file for complete search history.

(56) References Cited

U.S. PATENT DOCUMENTS 4,644,259 A * 2/1987 Boser ..................... G01R 31/64
324/519
10,016,788 B2 * 7/2018 Kato ..................... B06B 1/0292
(Continued)

FOREIGN PATENT DOCUMENTS

JP 61-108956 5/1986
JP 7-174802 7/1995
(Continued)

OTHER PUBLICATIONS

Decision to Grant a Patent dated Aug. 23, 2022 in Japanese Patent Application No. 2022-084743 (with English translation).
(Continued)

*Primary Examiner* — Thang X Le
(74) *Attorney, Agent, or Firm* — Wenderoth, Lind & Ponack, L.L.P.

(57) ABSTRACT

A capacitor inspection method includes applying a direct current (DC) bias voltage to an inspection capacitor with a value which is equal to or lower than a rated value of the inspection capacitor; inputting a first electric signal to the inspection capacitor, switching the input electric signal from the first electric signal to a second electric signal having a different waveform than the first electric signal and thereby generating a vibration containing a transient vibration in the inspection capacitor and eliciting a reaction voltage as an output from the inspection capacitor which contains a vibration response voltage generated by the vibration and the DC bias voltage; and measuring a transient response waveform from the vibration response voltage contained in the reaction voltage. A capacitor inspection apparatus includes a holder for the inspection capacitor; a DC voltage supply device; a signal generator; and a voltage or current measurement device.

9 Claims, 20 Drawing Sheets

(56) References Cited

U.S. PATENT DOCUMENTS

| | | | | |
|---|---|---|---|---|
| 2015/0123647 A1* | 5/2015 | Gisby | ................... | G01R 19/00 |
| | | | | 324/76.11 |
| 2015/0200039 A1* | 7/2015 | Taguchi | ................... | H01B 1/24 |
| | | | | 252/514 |
| 2016/0349106 A1* | 12/2016 | Zhu | ........................ | G01H 17/00 |
| 2017/0268939 A1* | 9/2017 | Orita | ....................... | G01L 1/142 |

FOREIGN PATENT DOCUMENTS

| | | |
|---|---|---|
| JP | 9-152455 | 6/1997 |
| JP | 9-330855 | 12/1997 |
| JP | 10-293107 | 11/1998 |
| JP | 2826422 | 11/1998 |
| JP | 11-219871 | 8/1999 |
| JP | 2000-150329 | 5/2000 |
| JP | 2003-43098 | 2/2003 |
| JP | 2009-295606 | 12/2009 |
| JP | 2009-302276 | 12/2009 |
| JP | 2017-40629 | 2/2017 |
| JP | 2021-148759 | 9/2021 |

OTHER PUBLICATIONS

International Search Report issued Jan. 17, 2023 in International Application No. PCT/JP2022/039539.
Bechou, et al., "Non-destructive detection and localization of defects in multilayer ceramic chip capacitors using electromechanical resonances", Quality and Rel. Eng. Int., vol. 12, pp. 43-53 (1996).
Johnson et al., "Nonlinear acoustic effects in multilayer ceramic capacitors", Review of Progress in Quantitative Nondestructive Evaluation, vol. 32B (AIP Conference Proceedings, vol. 1511), pp. 1462-1469 (2013).
Johnson et al., "Nonlinear resonant acoustic detection of cracks in multilayer ceramic capacitors", 2014 IEEE Ultrason. Symp. Proceedings (Chicago, Sept. 3-6, 2014), pp. 248-251 (2014).
Johnson et al., "Time-domain analysis of resonant acoustic nonlinearity arising from cracks in multilayer ceramic capacitors", AIP Conf. Proc., vol. 1706, Art. No. 060005 (2016).

* cited by examiner (A)

(B)

(A)

(B)

(C)

(A)

(B)

(A)

(B)

CAPACITOR INSPECTION METHOD AND INSPECTION APPARATUS USED FOR SAME

TECHNICAL FIELD

The present invention relates to a capacitor inspection method and an inspection apparatus used for the method.

BACKGROUND ART

Ceramic chip capacitors are small in size, high in reliability, and have large capacitance rating. Hence, they are mounted on almost all electronic devices and medical devices nowadays. However, ceramic capacitors are prone to mechanical defects (electrode abnormality, lamination displacement, voids, cracks) or the like, and often these defects are not identifiable with appearance inspection. At the production site, in order to exclude such defective pieces and ensure high reliability of capacitors, various nondestructive electrical characteristic tests such as capacitance measurement, insulation resistance, tan δ, and pulse withstand voltage are conducted.

The above-described electrical characteristic tests by no means complete. There are mechanical defects that do not leave trace on conventional test signals, or the electric power required to make the defects detectable is too high to the point that testing with such large electric signals is no longer "nondestructive".

As such, ultrasonic microscopy is often used in conjunction with electric characteristic tests.

In terms of on-the-line applicability, ultrasonic microscopy has some excellent characteristics. Namely, the system configuration is simple, defect signal has certain universality, and testing conditions are not required to be adjusted for individual capacitor. Nonetheless, again in terms of on-the-line applicability, ultrasonic microscopy has its own shortcomings. Due to diffusion in the air and reflection by the surface of the test object, ultrasonic microscopy requires a medium, normally water, for transmitting ultrasonic testing waves. In addition, since the penetration depth of ultrasonic sound is limited, testing sensitivity to detect internal defects is affected by the size of the capacitor. It also requires relatively long measurement and mapping time. Finally, at the curved edge of capacitor, ultrasonic sound is mostly reflected and the volume around the edge is masked from detection.

Recognizing forementioned shortcomings, defect detection techniques using the principle of electromechanical resonance have been proposed as an alternative for ultrasonic microscopy (PLs 1 to 4, NPL 1).

It is known that a geometrically simple structure having high symmetry such as a ceramic capacitor has characteristic mechanical resonance frequencies. When an oscillating electric field (voltage) is applied to a capacitor, mechanical vibration can be generated due to inverse piezoelectric effect. When the frequency of the applied electric field approaches to one of the resonance frequencies of the structure, amplitude of the mechanical vibration increases. The amplified mechanical vibration in turn generates electric field due to piezoelectric effect. The electric field generated by mechanical vibration is observed as additional potential difference across the capacitor. This generation of electric signal due to resonance with a mechanical oscillation is a phenomenon called electromechanical resonance.

PLs 1 to 4 and NPL 1 apply electromechanical resonance as inspection methods for capacitor's internal defects. The basic implementation of the methods is such that the frequency of applied alternating voltage is swept in discrete steps while applying high bias DC voltage to a capacitor, and the capacitor's electrical reaction (voltage, impedance or ESR depending on the method) is measured at a time in each frequency step. These conventional methods require a substantial amount of time to complete one inspection.

PL 4 is an inspection method that is using the same principle as forementioned ones but different in mechanism to generate a response voltage. In the proposal, it applies an alternating external stress, such as a vibration from an ultrasonic wave, while the target capacitor is DC-biased. Electromechanical resonance in this case results in impedance change, and the output current change is used to identify defective capacitors.

However, since the method in the proposal requires a DC bias voltage supply in addition to an external vibration source, it is not advantageous compared to the conventional ultrasonic microscopy which requires only an external vibration source.

Hence, even though the above proposals present methods of defect detection with the sensitivity equal to or higher than that of ultrasonic microscopy, they are not suitable for use in a production line considering the complexity of their system configuration and the inspection speed.

Apart from the conventional proposals mentioned above, studies on the nonlinear acoustic effect of a multilayer ceramic capacitor (MLCC) have been conducted by researchers of the National Institute of Standards and Technology, National Aeronautics and Space Administration (NASA), University of Maryland, and the like (NPLs 2 to 4). In these studies, capacitors with externally visible cracks are inspected. Their procedure involves mechanically exciting a capacitor's specific normal vibration mode with the electromechanical resonance effect using a tone burst signal, cutting off the tone burst signal and damping the amplitude of the response signal, and then determining whether the capacitor is defective or non-defective based on a change in the phase (or frequency) of the oscillatory mode.

Specifically, the above studies use the following steps to measure and inspect a capacitor.

a) Select a capacitor to be measured.
b) Sweep frequencies of the tone burst signal under a constant bias voltage condition and determine a normal frequency fi of the capacitor.
c) Under the same bias voltage condition, a tone burst signal whose signal frequency is set at fi and having the same signal amplitude as that used in the measurement of b) is input to the capacitor.
d) When the burst is off, the response voltage from the capacitor exhibits a damped oscillation. The response voltage initially oscillates at the frequency fi, but as the oscillation is damped, frequency (or phase) of the oscillation in a given time increment changes. This change in the frequency (or the change in the phase) is captured in a specific time frame and used to distinguish a defective capacitor from non-defective ones.

CITATION LIST

PL

PL 1: JP S61-108956 A
PL 2: JP H07-174802 A
PL 3: JP 2826422 B2
PL 4: JP H11-219871 A

NPL

NPL 1: L. Bechou, S. Mejdi, Y. Ousten, and Y. Danto, "Non-destructive detection and localization of defects in multilayer ceramic chip capacitors using electromechanical resonances", Quality Rel. Eng. Int., vol. 12, pp. 43-53, 1996

NPL 2: W. L. Johnson, S. A. Kim, T. P. Quinn, and G. S. White, "Nonlinear acoustic effects in multilayer ceramic capacitors", Review of Progress in Quantitative Nondestructive Evaluation, Vols. 32B (AIP Conference Proceedings, vol. 1511), pp. 1462-1469, 2013 NPL 3: W. L. Johnson, S. A. Kim, G. S. White, and J. Herzberger, "Nonlinear acoustic detection of cracks in multilayer ceramic capacitors", 2014 IEEE Ultrason. Symp. Proceedings (Chicago, Sep. 3-6, 2014), pp. 248-251

NPL 4: W. L. Johnson, S. A. Kim, G. S. White, J. Herzberger, K. L. Peterson, and P. R. Heyliger, "Time-domain analysis of resonant acoustic non-linearity arising from cracks in multilayer ceramic capacitors", Proc. AIP Conf. Proc., vol. 1706, 2016, Art. No. 060005

SUMMARY OF INVENTION

Technical Problem

However, the methods used in the studies of NPLs 2 to 4 have the following shortcomings in principles of the method and in the practical applicability.

First, in term of the principle, the method requires to fix a measurement target to single normal mode of vibration and trace the mode. If the signal frequency of the input tone burst signal is shifted even slightly from the target normal mode of vibration, the other normal vibration modes will be mixed in, resulting in an unstable measurement. Further, even if the vibration is in the assumed mode at the instant when the tone burst is cut off, the other modes may interfere over time due to the coupling between the modes, and again, the measurement is likely to become unstable. In fact, divergence of the phase determined in the late stage of damping is shown in the study (NPL 4, FIG. 6 and FIG. 7). It is mentioned that the time window in which the measurement is considered valid has to be restricted.

It is known that a capacitor with internal defects may exhibit secondary resonance modes in addition to the primary normal vibration modes as shown in FIG. 3. In principle, the above-described study method fixes the measurement target to oscillation of single primary mode and the contribution from secondary modes are left unaccounted for.

In terms of practical applicability, the method used in the studies described above does not present sufficient sensitivity or accuracy for defect detection. In the above studies (NPLs 2 to 4), capacitors subject to classification are not the capacitors with internal defects, but only those with externally apparent cracks whose defects can be detected by visual inspection or appearance inspection. In addition, in NPL 2, the signal frequency of the tone burst signal is changed in a stepwise manner in attempt to identify normal vibration modes of a capacitor. It is evident that the method has detected only one normal vibration mode where there should be many (NPL 2, FIG. 2). The method has insufficient resolution for determining the normal vibration modes and is prone to large systematic errors.

The lack of the accuracy and sensitivity can be attributed to vulnerability of the circuit configuration to parasitic noise and destabilized measurement conditions. In the device configuration of the above studies (NPL 4, FIG. 2), the response signal is output not just from the capacitor, but also from the entire circuit in which the capacitor, battery, and resistor are connected in parallel, and thus the pure reaction of the capacitor is not measured. Further, since the signal waveform input terminal and the signal output terminal for measurement are shared (that is, a so-called two-terminal measurement method), noise due to parasitic resistance, parasitic inductance, and the like are likely to be superimposed on the output signal and affect measurement. Further, impedance of a capacitor in a high frequency rage becomes minimal, the load impedance to the signal output system becomes unstable, and the voltage that drives capacitors may be varied from capacitor to capacitor even with the slightest influence of the parasitic impedance such as resistance.

The tact time, and thus the production speed, is critical in a practical application. The inspection method of the above studies requires determination of the target normal mode frequency for each inspecting capacitor prior to applying tone burst signal. This means for each inspection run, repetitive measurement and adjustment of testing parameters is necessary and thus requires more time. It is not possible to designate single value for capacitor's normal mode frequency because the normal mode frequency for each capacitor in the testing group varies, even if the group consists of capacitors with the same parts number and of the same lot, due to a slight difference in manufacturing conditions such as material composition and firing conditions. This is a major drawback of the method where high speed inspection is critical.

Finally, expensive, and large-scale devices including phase-sensitive receiver and active diplexer are necessary to implement the inspection method of the studies described above. The system configuration may be too complex and expensive to be applied on a real production line.

The present invention has been motivated by the above-described conventional circumstances and shortcomings. The first objective of the present invention is to provide a nondestructive inspection method for capacitors and dielectric electronic components which are: suitable to be applied on a production line; precluding the use of voltage or current that exceeds the rating; and fast and reliable in detecting internal defects. The second objective of the present invention is to provide an inspection apparatus to implement the inspection method.

Solution to Problem

The capacitor inspection method of the present invention is characterized by the following aspects.

First, to each capacitor in the testing group, the capacitor inspection method imposes:
- a step of applying a DC bias voltage to an inspecting capacitor whose value is equal to or lower than the rated value of the inspecting capacitor;
- a vibration response voltage generating step with a procedure of inputting a first electric signal to the inspecting capacitor, switching the input electric signal from the first electric signal to a second electric signal having a different waveform from that of the first electric signal and thereby generating a vibration containing a transient vibration in the inspecting capacitor and eliciting a reaction voltage as an output from the inspecting capacitor which contains a vibration response voltage generated by the vibration and the DC bias voltage; and
- a transient response waveform measurement step of measuring a transient response waveform from the vibration response voltage contained in the reaction voltage.

Second, it is preferable that the capacitor inspection method according to the first aspect further comprises a quality determination step of determining the quality of the inspecting capacitor from the transient response waveform measured in the transient response waveform measurement step with the criteria based on the differences in transient response waveforms of non-defective capacitors and defective capacitors.

Third, in the capacitor inspection method according to the first or second aspect, and in the vibration response voltage generating step, it is preferable that the first electric signal of an initial input and the second electric signal for switching are applied with a load impedance adjustment to the inspecting capacitor.

Fourth, in the capacitor inspection method according to any of the first to third aspects, and in the transient response waveform measurement step, it is preferable that a filtering process is applied in which the DC bias voltage is removed from the reaction voltage and the vibration response voltage is singled out.

Fifth, a capacitor inspection apparatus according to the present invention comprises: a holder portion to place an inspecting capacitor;

- a DC voltage supply device that is connected to an input side of the holder portion;
- a signal generator that is connected to the input side of the holder portion; and
- a voltage/current measuring device that is connected to an output side of the holder portion, wherein
- the DC voltage supply device applies a DC bias voltage to the inspecting capacitor,
- the signal generator inputs a first electric signal to the inspecting capacitor, then switches the first electric signal to a second electric signal having a different waveform from that of the first electric signal and thereby generates a vibration containing a transient vibration in the inspecting capacitor and elicits a reaction voltage as an output from the inspecting capacitor which contains the DC bias voltage and a vibration response voltage generated by the vibration,
- and the voltage/current measuring device measures a transient response waveform from the vibration response voltage that is contained in the reaction voltage.

Sixth, it is preferable that the capacitor inspection apparatus according to the fifth aspect further comprises:

- a bridge load divider that is connected in series between the holder portion and the signal generator; and
- a filter circuit that is connected in parallel to the holder portion, wherein
- the bridge load divider stabilizes the first electric signal, the second electric signal and hence the output of the reaction voltage, and
- the filter circuit singles out a vibration response voltage by removing a DC component of the DC bias voltage from the reaction voltage.

Seventh, it is preferable that in the capacitor inspection apparatus according to the sixth aspect, the bridge load divider is comprised of resistors and/or inductors.

Eighth, it is preferable that in the capacitor inspection apparatus according to the sixth or seventh aspect, the filter circuit is an RC high-pass filter circuit comprised of capacitors and resistors.

Advantageous Effects of Invention

The capacitor inspection method of the present invention is a type of an ultrasonic flow detection technique. It uses the reaction of electromechanical resonance as a vibration source and obtains information on the resonance characteristics of the capacitor from a transient response of the vibration change to detect defects. It does not require an external vibration source. Since vibration is generated from the electromechanical resonance effect, a medium for transmitting the vibration from the external source is not necessary, and the inspection sensitivity is not limited by the size of the capacitor. Further, since transient response is used, the time required for each inspection measurement is limited only by the convergence time of a transient response. This enables the measurement to be performed in a very short time, for example, in order of 2 ms. Hence, the present invention can be applied to a production line where high speed inspection is required.

Finally, in the inspection method of the present invention, it is not necessary to adjust the measurement conditions for each inspecting capacitor. The inspection can be performed under the common conditions for a certain group of capacitors, for example, a group of capacitors having the same lot number or of the same type.

The method of the present invention is capable of selectively extracting resonance characteristics of a capacitor including reactions of defects with high measurement stability and across a wide range of frequency. It can identify defects with high accuracy. Furthermore, the inspection method and the apparatus configuration required for implementation are both simple. The entire inspection system can be constructed at a low cost and in a small space.

BRIEF DESCRIPTION OF DRAWINGS

FIG. 2 is a comparison between a frequency distribution of a transient response waveform and a resonance curve, wherein FIG. 2(A) is a graph obtained by decomposing the damped transient response waveform of FIG. 1 into a frequency spectrum, and FIG. 2(B) is the resonance curve of the same capacitor measured by the step frequency sweep technique.

FIG. 3 shows a comparison of resonance curves measured with a conventional technique between a non-defective capacitor and an internally defective capacitor, wherein FIG. 3(A) shows the resonance curve of the non-defective capacitor and FIG. 3(B) shows the resonance curve of a defective capacitor exhibiting secondary peaks due to defects.

FIG. 8 shows a voltage response of a non-defective capacitor when an FSK signal is input, wherein FIG. 8(A) shows a vibration response voltage of the capacitor when the signal is set to carrier wave frequency 1100 kHz and hop frequency 2200 kHz, FIG. 8(B) shows the frequency spectrum of a transient response waveform, and FIG. 8(C) shows a resonance curve of a reference non-defective capacitor.

FIG. 9 shows a voltage response of a non-defective capacitor when a tone burst signal is input, wherein FIG. 9(A) shows the vibration response voltage of the capacitor when the signal frequency is set to 800 kHz, FIG. 9(B)

shows a frequency spectrum of the transient response waveform, and FIG. 9(C) shows a resonance curve of a reference non-defective capacitor.

FIG. 10 shows a voltage response of a non-defective capacitor when a two-frequency mixed waveform burst is input, wherein FIG. 10(A) shows the vibration response voltage of the capacitor generated by a mixed wave of sine waves of frequencies 682 kHz and 1202 kHz, FIG. 10(B) shows the frequency spectrum of a transient response waveform, and FIG. 10(C) shows a resonance curve of a reference non-defective capacitor.

FIG. 11(A) and FIG. 11(B) each shows a transient response waveform from a separate non-defective capacitor, and FIG. 11(C) and FIG. 11(D) each shows a transient response waveform from a separate internally defective capacitor.

DESCRIPTION OF EMBODIMENTS

Figure 1:
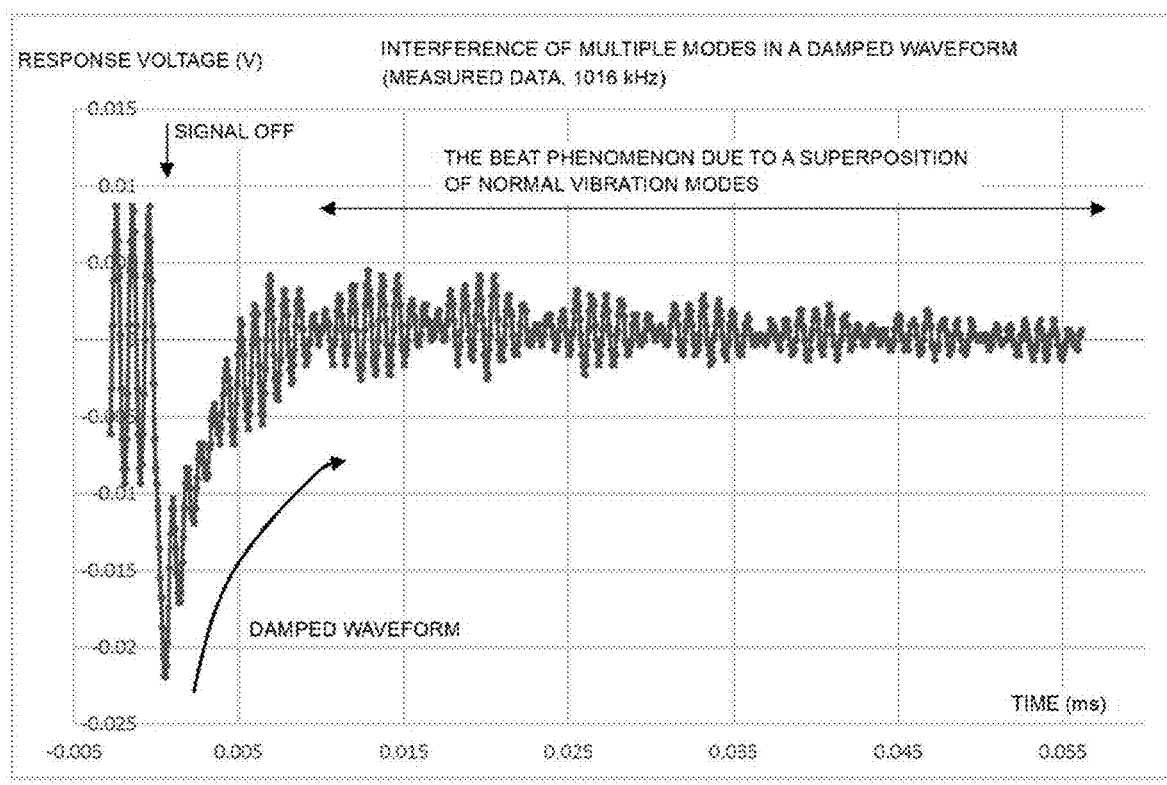
FIG. 1 is a plot showing an interference of normal vibration modes in a damped transient response waveform generated with a tone burst signal of the signal frequency 1016 kHz.

In the capacitor inspection method according to the present invention, an inspecting capacitor is vibrated with a set of conditions by a first electric signal, and then, the input electric signal is switched to a second electric signal having a different waveform. The switching elicits a transient vibration response in the capacitor, and multiple normal vibration modes of the capacitor that are selectively excited are mixed in to the transient response. The piezoelectric effect converts the vibration and the transient vibration generated by the first and the second electric signal into a voltage. The output response from the capacitor is a voltage waveform in which the vibration response is superimposed or interfered with the input electric signal (vibration response voltage).

Extracting a portion from the vibration response voltage corresponding to a transient response, which can be identified by the moment of signal switching from the first electric signal to the second electric signal, the determination of whether the capacitor is defective or non-defective is made based on a comparison of the transient response waveform to those of non-defective capacitors and to those of the defective capacitors.

The capacitor inspection method according to the present invention includes, as steps to generate and measure a waveform responding to a mechanical vibration of the target capacitor:

a DC bias voltage applying step of applying a DC bias voltage that is equal to or lower than the rated voltage of the capacitor, a vibration response voltage generating step of switching an input electric signal to generate transient vibration, converting the generated vibration into voltage, and outputting a response signal, and a transient response waveform measurement step of measuring and extracting a portion corresponding to a transient response from the vibration response voltage.

The capacitor inspection method according to the present invention further includes, as a step to analyze the measured waveform and judging the presence or absence of a defect, a quality determination step of determining the quality of the capacitor based on the characteristics of the transient response waveform.

(Inspection Target Capacitor)

For the inspection method of the present invention, there is no notable limitation for capacitors that can be subject to inspection, provided that they are made of dielectric materials. Types of capacitors that can be tested include a multilayer ceramic capacitor, a disk-shaped ceramic capacitor, a film capacitor, and an electrolytic capacitor. The inspection method of the present invention is especially suitable for inspection of a multilayer ceramic capacitors made of ferroelectric material such as barium titrate.

<DC Bias Voltage Applying Step>

In the capacitor inspection method according to the present invention, the first step is to apply DC bias voltage onto a capacitor subject to inspection. The bias voltage is equal to or lower than the rated voltage as mentioned above.

By applying a DC bias voltage, the goal in a DC bias voltage applying step is to promote polarization and enhance piezoelectric effect in an inspecting capacitor. Modern multilayer ceramic capacitors (MLCC) in general employ ferroelectric material such as barium titrate in order to accomplish compactness and high capacitance. Although a barium titrate crystal itself is ferroelectric and has built in polarization, overall polarization and thus the inverse piezoelectric effect (deformation due to an electric signal) do not become eminent under an AC-field with no offset. With a DC-bias voltage applied, however, polarization is increased, and the inverse piezoelectric effect can be remarkably exhibited.

The applied DC bias voltage needs to be sufficiently constant while a capacitor is measured and inspected, (that is, while the capacitor is vibrated and the transient response waveform is measured), but it does not need to be constant when the measurement of a transient response waveform is complete. For example, a rectangular wave having a period twice or more the inspection time, a sine wave having a period sufficiently longer than the inspection time, or the like can be used.

The bias voltage in the DC bias voltage applying step can be applied without a particular limitation provided that the bias voltage is equal to or lower than the rated voltage of the inspecting capacitor, though it is preferable to apply a bias voltage of 60% or lower of the rated voltage for a better inspection accuracy.

<Vibration Response Voltage Generating Step>

This step applies a principle in physics that states when a state of a vibrating structure shifts from one steady-state vibration to another steady-state vibration, the transient vibration state contains information on resonance characteristics of the structure.

In the vibration response voltage generating step, an inspecting capacitor is initially vibrated with a first electric signal of a waveform A, it is then switched to a second electric signal of a waveform B to generate a transient vibration containing information on resonance characteristics of the capacitor.

A transient vibration is generated when the electric signal input to the capacitor is switched, after the first electric signal is input for a specified time, to the second electric signal having a different waveform from that of the first electric signal. The transient vibration and other vibrations generated with the first and second electric signals are converted into a vibration response voltage with the inverse piezoelectric effects of the electromechanical resonance. In the end, the capacitor outputs a reaction voltage in which a DC bias voltage and the vibration response voltage that contains a response from the transient vibration are combined.

When an electric signal is input to a capacitor, the electric signal functions as a vibration source (stress) to the capacitor. Given the structure of a capacitor, the direction of the electric field generated under an applied voltage is fixed to one axis in the capacitor's body, and the direction and magnitude of the electric field are uniquely determined by the value of the input electric signal.

With an oscillating electric signal input to a capacitor, differentials of the generated electric field at the boundaries of internal electrodes of the capacitor acts as a stress source, and a vibration propagates in the body of the capacitor exciting the electromechanical resonance effect.

The propagation of vibration is a phenomenon that can be described by a wave equation. Due to the alternating stress exerted at a constant frequency, the capacitor dissipates excess energy in a form of heat or stores the energy in a form of structural vibration, and, after a certain period of time, it reaches an equilibrium stable. For example, when signal input is switched to a DC signal for a capacitor oscillating with an electric signal, since DC signal does not change with time, the vibration of the capacitor is damped and disappears after a certain time is elapsed, regardless of the initial vibration state of the capacitor before the switching. Similarly, when signal input is switched to a sine wave of a frequency f, after a certain time is elapsed, the capacitor reaches a stable vibration state of frequency f, regardless of the initial vibration state of the capacitor.

The stable vibration state described above is referred to as steady state vibration. The form of a steady state vibration corresponds to the periodicity of the applied stress; it forms a one-to-one relation to the periodicity (waveform) of the input electric signal.

A geometrically simple structure such as a capacitor has multiple modes of mechanical resonances at localized frequencies (normal modes of vibration). When the frequency of the exerted stress matches one of the resonance frequencies, vibration amplitude is greatly increased.

On the other hand, when a capacitor is vibrated under a periodic stress by a first electric signal of waveform A (the steady-state vibration in waveform A), and if the input electric signal is switched to a second electric signal of waveform B which exerts stress at different frequency, the vibration of the capacitor eventually converges to the frequency of waveform B after a certain time period (the steady-state vibration of waveform B). However, a mixed waveform appears in the transient state. In the transition from the steady-state vibration of waveform A to the steady-state vibration of waveform B, a vibration in the structural normal vibration modes arises from the capacitor and combined with the forced vibration by the stress of waveform B. Similarly, when a capacitor is vibrated under a periodic stress by a first electric signal of waveform A, and if the stress forcing the oscillation is cut off, that is, if the waveform of the second electric signal is set to a DC signal of V=0, the capacitor vibrates in a damped oscillation in which multiple normal vibration modes of the structure are mixed.

Figure 2:
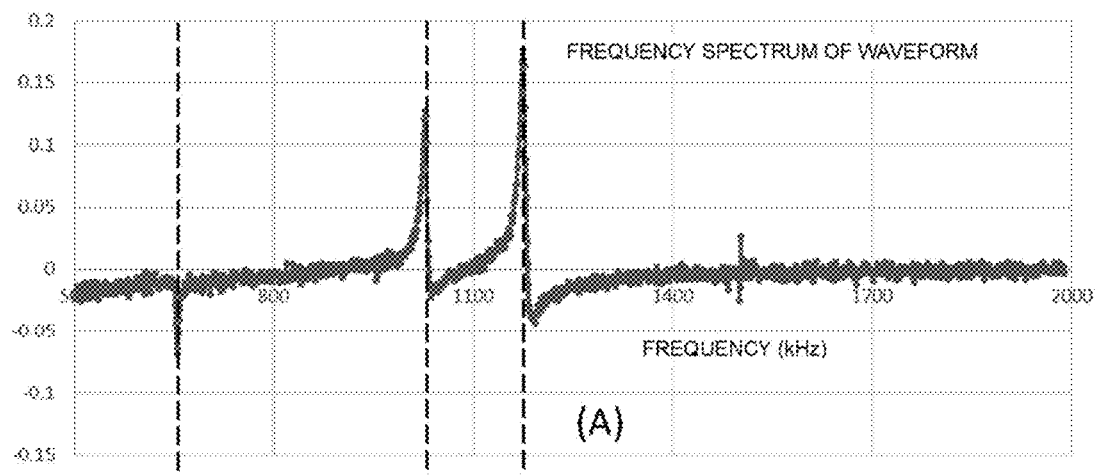
Figure 2:
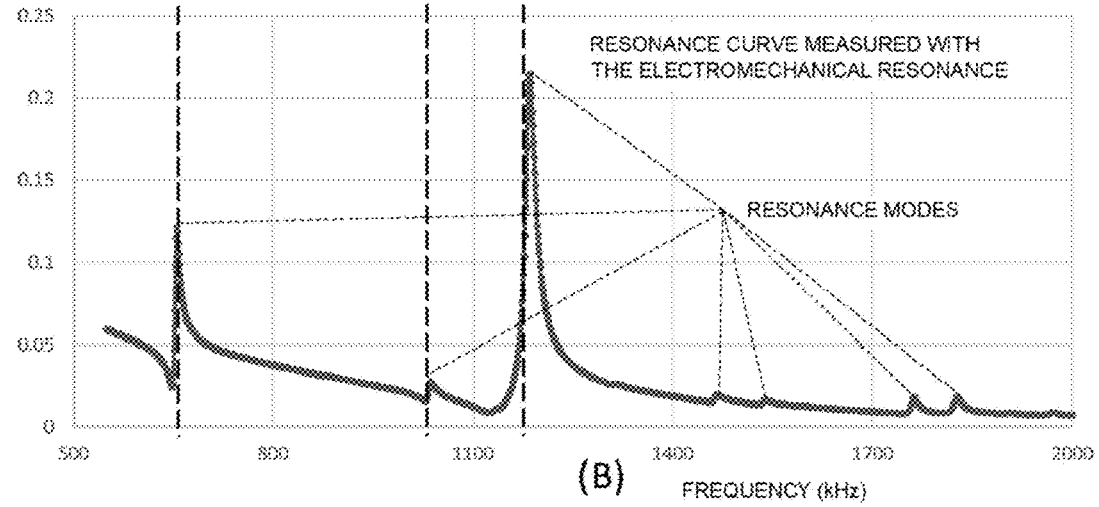
Figure 3:
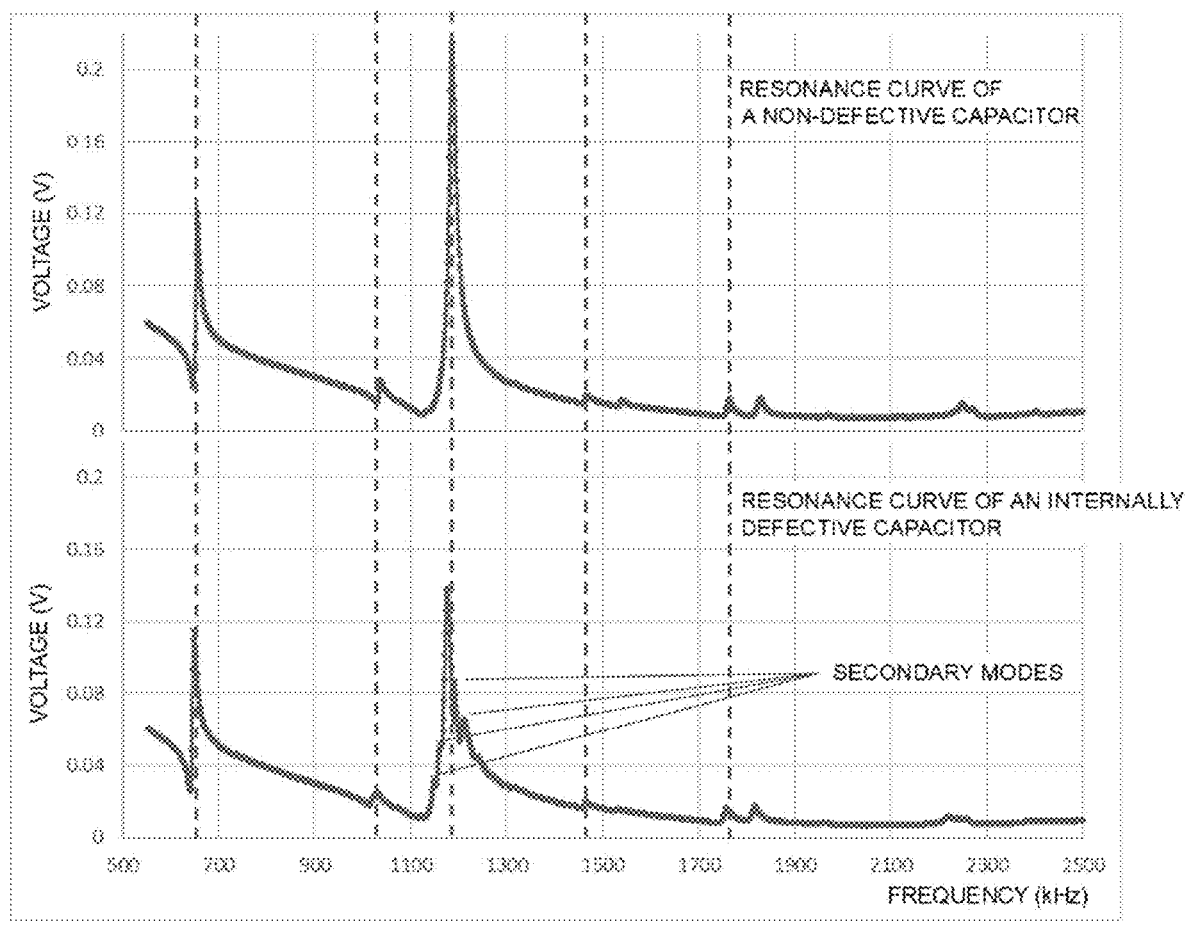

FIGS. 1 and 2 are measurement examples of a capacitor's structural normal vibration modes. As the first electric signal, a sinusoidal wave of 1016 kHz is input to the capacitor and vibrates the capacitor in the corresponding steady state. The input electric signal is then switched to the second electric signal which is a DC signal of V=0. The generated vibration is measured with voltage signal.

As shown in FIG. 1, after the first electric signal is switched to the second electric signal, by which the external stress exerted on the capacitor is terminated, the vibration of the capacitor is damped to a null state. This damped waveform represents a transient vibration. Further, as can be understood from FIG. 2, the transient vibration, generated in the region of the second electric signal input, is a mixture of multiple normal modes of vibration of the capacitor's structure, and it is independent of the frequency (1016 kHz) of the first electric signal.

The wave equation representing the propagation of vibration in a capacitor is a linear differential equation, and a linear superposition of the solutions of a linear differential equation is also a solution. For example, for a capacitor in a given vibration state, if a steady state vibration is reached with an input electric signal of waveform G after a period of time and the same is true for an input electric signal of a waveform H, the capacitor can also reach to a steady vibration state with the input electric signal in which waveform G and the waveform H are superimposed after a certain period of time.

The steady state vibration is defined by the periodicity of the waveform of the stress exerted to force the oscillation. Here, without a loss of generality, a waveform of a steady state vibration of a capacitor can be given as $$s(t)=V_0+V_1 \sin(2\pi f_1 t+\varphi_1)+V_2 \sin(2\pi f_2 t+\varphi_2)+V_3 \sin(2\pi f_3 t+\varphi_3)+\ldots$$

This waveform is defined in a time range $-\infty<t<\infty$. It can be uniquely identified by fixing the phases at a specific reference time $t_0$. A set S is a set of a collection of waveform s in which s takes of all possible combinations for values of the parameters (V, f, φ).

In the present invention, the waveforms of a first electric signal and a second electric signal, which correspond to vibration waveforms in steady states, are limited to waveforms in set S and those having zero frequency components, those constructed with a finite number of frequency components, or those having a defined frequency $f_0$.

The set of such waveforms is denoted as S1.

For illustration, the following examples of waveforms belonging to S1 are given, but the scope of the invention is not limited to these waveforms.

(i) 0 (null signal)
(ii) $V_0$+Sin (2πft+φ) (combination of a sinusoidal with DC voltage)
(iii) Sin (2πft)+Sin (4πft)+Sin (6πft)
(iv) a rectangular wave of frequency f
(v) Sin (2πft)+Sin (2πeft) (here, e is the base of natural logarithm)

In these examples, (i) is a waveform with zero frequency components. (ii) has a waveform frequency f. (iii) is comprised of 3 frequency components and has a waveform frequency ⅙f. (iv) can be expressed as a linear superposition of frequency elements in an infinite series, and has the waveform frequency f. (v) is the superposition of two frequency components, but does not have a waveform frequency, and vibrates in an aperiodic manner.

Further, a subset set of S1 which are comprised of waveforms with oscillation periodicity (that is, have a waveform frequency $f_0$) and waveforms with zero frequency components (that is, a DC voltage) is denoted as S2.

The motion state of a vibrating capacitor (represented by the displacement amount of the capacitor in the spatial coordinates and the time rate of change of the displacement) at a given time ($t_r$) is denoted by $U_r$.

A capacitor vibrating in a steady state by a periodic input electric signal is in the same motion state $U_k$ at each repeating point in the signal waveform, that is, at time points ($t_k$) of the same phase in the waveform.

On the other hand, if a capacitor is vibrating in a steady state with an aperiodic signal, repeating points in the waveform do not exist. In a such case of an aperiodic waveform, in order to specify a motion state ($U_r$) of the capacitor in a steady state vibration, the time elapsed from the start of the signal input to t, and the signal waveform during the period needs to be identical.

In the present invention, by forcing an inspecting capacitor to a steady state vibration with a first electric signal of waveform A, a capacitor's motion state at the time of switching (t=$t_s$) is fixed to a specific state $U_s$. Then, the capacitor's vibration is forced to another steady state vibration with a second electric signal of waveform B. A transient vibration occurs in the transition.

This method of switching the electric signals (switching from the first electric signal to the second electric signal at the specific state $U_s$) guarantees generation of a consistent transient vibration in inspecting capacitors. The transient vibration serves as the reference observable in inspection for a group of capacitors of the same type and shape.

(Parameter Settings for Electric Signal Switching)

Below descriptions are intended to clarify elements required and parameter settings for a process of switching of the electric signals in the present invention. In a typical case of switching, the definition of elements and conditions for parameter setting are as follows.

(a) a time constant $T_c$ representing the duration of a transient response of a capacitor
(b) a waveform A from S1
(c) a waveform B from S1
(d) $t_0$ which corresponds to the reference time point and the input start time for the signal of waveform A
(e) $t_s$ which serves as: the input end time for a signal of waveform A, the input switching time to a signal of waveform B, and the reference time point for a signal of waveform B, ($t_s - t_0 \geq T_C$)
(f) the start time $t_i$ and the end time $t_r$ of a measurement, ($t_0 \leq t_i < t_r$, and $t_s < t_f$)
(g) the signal input end time $t_f$ for waveform B (Procedure of Electric Signal Switching)

The switching procedure for electric signals is as follows. First, a first electric signal of waveform A is input to a capacitor until the capacitor vibrates in a steady state vibration. The first electric signal is then switched to a second electric signal of waveform B when the capacitor is in the target motion state $U_s$. A transient vibration is generated with the initial motion state of the capacitor fixed to $U_s$. The transient vibration persists until the capacitor reaches a steady vibration of waveform B.

Figure 4:
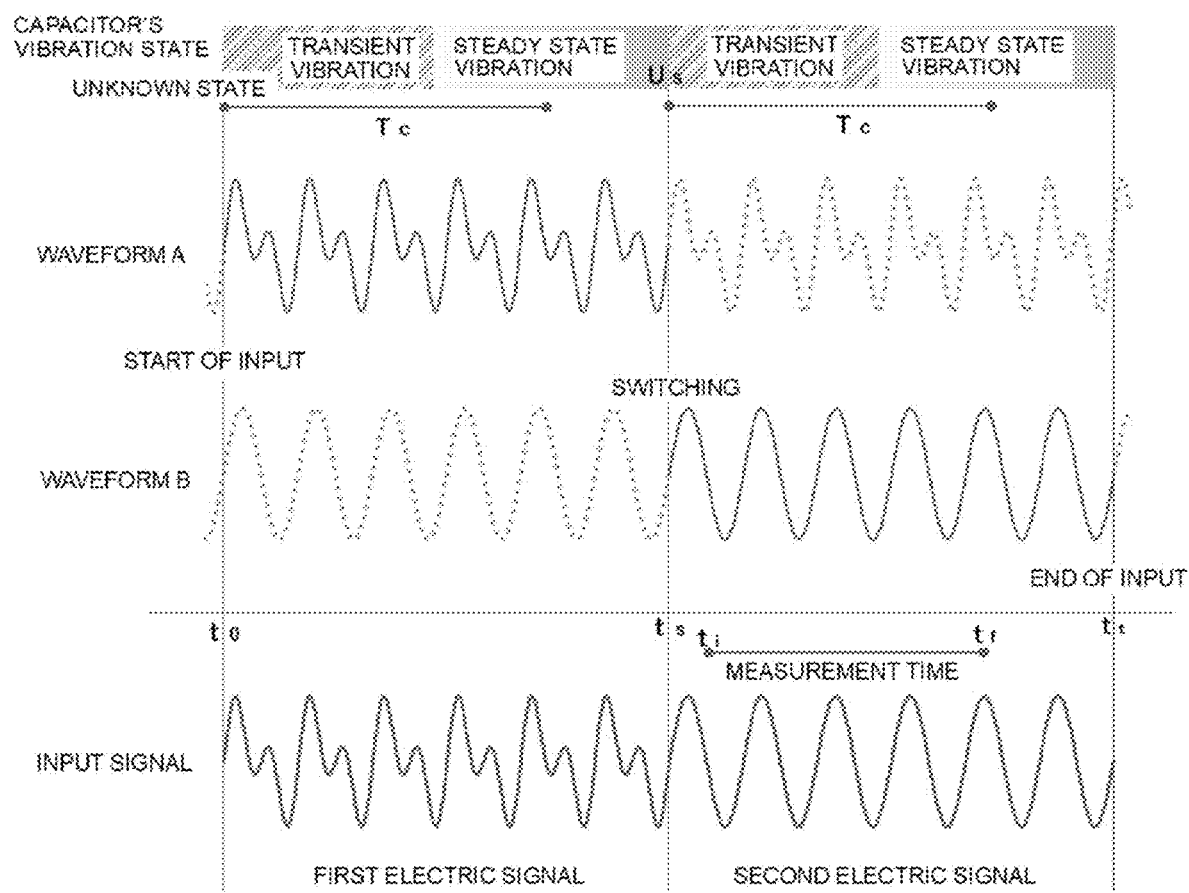
FIG. 4 is a chart showing a switching of an electric signal from waveform A to waveform B with vibration states of capacitor in a time sequence.

An example embodiment of switching of an electric signal will be illustrated below. FIG. 4 is a time chart in sequence showing a signal switching process from waveform A to waveform B and the associated vibration/motion states of the capacitor.

For the embodiment shown in FIG. 4, the first step is to determine the value of time constant $T_C$ suitable for the capacitor group being inspected. The time constant $T_C$ is an indicator for the persistence of a transient response of a capacitor, and it is based on the time it takes for a transient response to converge to a steady state. The time required for a transient vibration to disappear varies depending on the input signal amplitude and shape, type, or the initial motion state of the capacitor. Though it is generally equal to or less than 1 ms for capacitors of sizes of 3216 and 3225, for example.

At the input start time (t=$t_0$), a first electric signal of waveform A is input to the capacitor. Waveform A is a waveform belongs to S1. The phase, frequency, or amplitude of the waveform (or the phase, frequency, or amplitude of individual constituent elements of the waveform) is set using the signal input start time (t=$t_0$) as the reference time of the waveform.

The first electric signal of waveform A is input to a capacitor for a period of time exceeding $T_c$ until the capacitor reaches to a steady state vibration. The unknown initial vibration and transient vibration are erased from the capacitor.

The input time of the first electric signal ($t_s - t_0$) is same for each capacitor. In such control, the motion state of a capacitor at the time of signal switching (t=$t_s$) is fixed to single state $U_s$, and it does not vary from capacitor to capacitor.

If waveform A is a waveform having a defined periodicity (that is, waveform A belongs to S2), the electric signal of waveform A may be input until the time of (t≥$t_0$+$T_C$), and then the signal is switched at a given point of the period repetition of the waveform A, that is, a point with the same phase. In such control, the input time of the first electric signal may vary from capacitor to capacitor, but the motion state $U_s$ at the time of switching is still fixed to single state.

At (t=$t_s$), the electric signal input to a capacitor is switched from the first electric signal of waveform A to a second electric signal of waveform B. At this moment, a transient vibration is generated with the initial motion state $U_s$. After switching, the vibration of capacitor is led to a steady vibration of waveform B.

Waveform B is a waveform belongs to S1. The phase, frequency, or amplitude of the waveform (or the phases, frequencies, or amplitudes of individual constituent elements of the waveform) is set with the input switching time ($t=t_s$) as the reference time of the waveform.

The vibration response of a capacitor is measured in the given time window ($t_i \le t \le t_f$). The measurement start time $t_i$ can be any time satisfying $t_0 \le t_i$, though under a standard setting, it coincides to $t_i = t_s$. The measurement end time $t_f$ can be any time satisfying $t_s < t_f$. It is noted that if $t_f - t_s \ge T_C$, maximum information on a transient response can be obtained.

At $t=t_t$ the input electric signal is terminated. Under a standard setting, it satisfies $t_e \ge t_f$.

(Continuous Switching of Signals)

The input electric signals can be continuously switched from waveform A to waveform B by continuously changing parameters such as phase or amplitude of waveform A and smoothly matching to waveform B at $t=t_s$. In such a case, the vibration response of capacitor generated from the time ($t=t_s$) when waveform A is deformed is considered a transient response. Examples of such forms of switching include a sweep signal modulating the frequency in a short period of time to another frequency, or an amplitude modulation signal with an exponential damping of the amplitude of the signal.

Even in the case of continuous switching, in order to observe consistent transient responses from the inspecting capacitors, the transition waveform from waveform A to waveform B needs to be identical for each inspecting capacitor. The transition time for the input signal waveform to converge to waveform B, that is, the time it takes for the difference between waveform B and the input signal waveform becomes smaller than the voltage measurement sensitivity & of the system, needs to be shorter than the duration Tc of transient response.

(Periodic Switching of Electric Signal)

As a variation, an external switching signal can be employed for periodic and repeated switching of the input waveforms. The switching is performed at a point of choice triggered by the external signal. As an example, a rectangular wave of a constant frequency can be used to control switching of waveforms. In the control, it can be conditioned when the rectangular wave is in a rise, the input electric signal is switched to the second electric signal of waveform B from the first electric signal of waveform A, and when it is in a fall, the input signal is switched to the first electric signal of waveform A from the second electric signal of waveform B. A measurement can be taken at an arbitrary rising point of the rectangular wave.

In the control method for periodic switching, if the waveform generator can adjust phase (or can adjust the reference time point) of the input signal waveforms to the given values at every time the waveforms are switched, or if the waveform generator functions to output signal of the same phases at switching, the single-shot waveform switching procedure illustrated in detail above can be applied.

Figure 5:
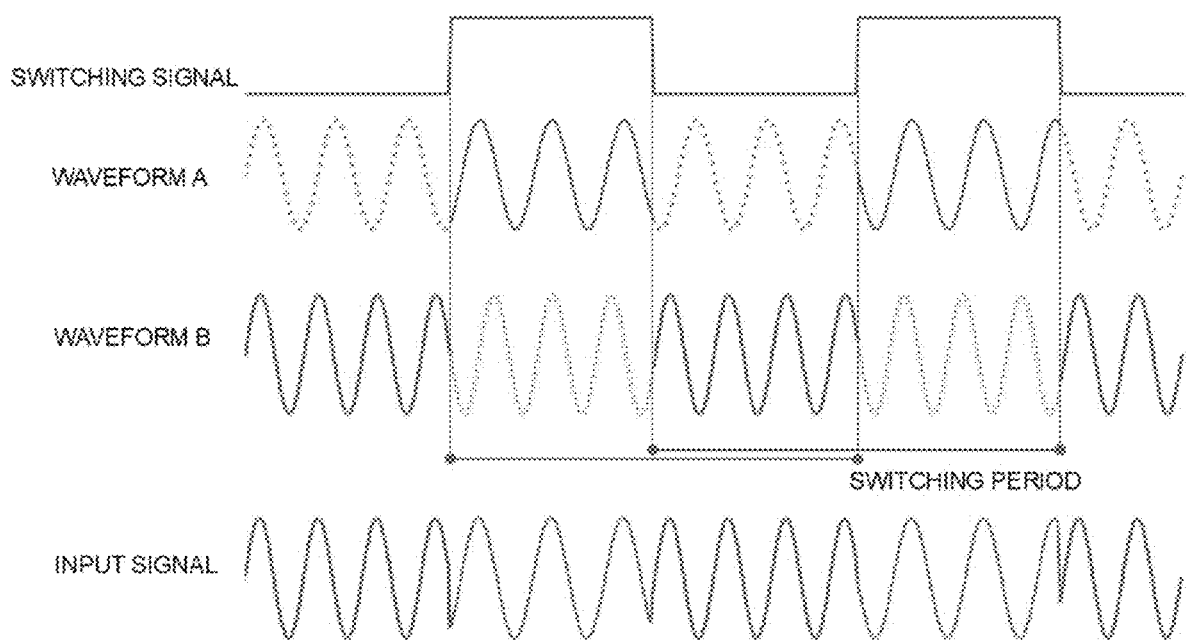
FIG. 5 is a chart showing a periodic switching of signals with waveforms of fixed phases.

On the other hand, if the phases of the first electric signal of waveform A and the second electric signal of waveform B are fixed at a certain reference time and the subsequent switching is performed with the waveforms of the absolute phase, as shown in FIG. 5, the phases of a first and a second input electrical signal may vary for each switching point. In such a case, to measure a consistent transient response, the following conditions are imposed to the waveforms and the phases of the input signals at each switching point are matched.

For matching of phases at each switching point, both waveform A of the first electric signal and waveform B of the second electric signal need to be from S2, that is, waveforms of each with a defined periodicity. Further, denoting the period of the switching signal by P, and the periods of waveform A and waveform B by $P_A$ and $P_B$, respectively, conditions for phase matching are imposed such that $$P/P_A = k, P/P_B = m$$

where k and m are integers.

For each cycle of waveform switching, the ratio of occupancy time of a waveform to the cycle time is generally called a duty ratio. The duty ratios of the first electric signal of waveform A and the second electric signal of waveform B are denoted by $D_A$ and $D_B$, respectively.

The duty ratio is constant for each switching cycle, and $D_A + D_B = 1$ is satisfied by definition. Hence, signal switching from the first electric signal of waveform A to the second electric signal of waveform B or vice versa will occur at the same period P. It follows that the phases of the waveforms at the time of switching are matched at each switching cycle.

If it is further imposed that the phase of the first electric signal of waveform A to be the same at the time of input start and at the time of input end (that is, at the time of switching to waveform B) in a switching cycle, in addition to $P/P_A = k$, the additional condition $D_A \times P/P_A = q$ (where q is an integer) is required. Similarly, if it is imposed that the phase of the second electric signal of waveform B to be the same at the time of input start and at the time of input end, in addition to $P/P_B = m$, the additional condition $D_B \times P/P_B = r$ (where r is an integer) is required. The q and r can be understood as the number of cycles of the waveforms in one switching cycle.

In any of the cases, the capacitor needs to be vibrating in a steady state vibration at an input end time of a first electric signal of waveform A. Then, for the duty ratio $D_A$ of waveform A, $$D_A \times P \ge TC$$

is required.

In addition, the measurement time for a transient vibration after the waveform is switched to the second electric signal of waveform B needs to be sufficient. Therefore, for the duty ratio $D_B$ of the waveform B, $$D_B \times P \sim T_C$$

is preferred.

If waveform A or waveform B is a DC voltage, there is no restriction on the periods of these waveforms, and only limitation is on the input time by the duty ratio.

The optimum waveform conditions for implementing the inspection method according to the present invention will be described in detail below.

First, it is preferable that either a first electric signal of waveform A or a second electric signal of waveform B has an oscillatory signal waveform to accumulate vibration energy in the inspecting capacitor. An oscillatory signal waveform is a waveform in which the second-order time derivative of the waveform contains multiple peaks in the input time of the signal.

It is preferable that the frequency components of the signal waveforms used in the present invention are set to values separate with a certain margin from the frequencies of the normal vibration modes of capacitors of the testing group in consideration of the variations in each sample. If either of the waveform frequencies before and after the switching coincides with a normal mode frequency of the inspecting capacitor, the mode becomes dominant in the transient vibration, and the sensitivity to other modes including the defect is relatively reduced. Further, if the frequency of waveform A is too close to a normal mode frequency, due to a large change in vibration amplitude with frequency near the peak, a slight difference in the normal mode frequency of a particular sample is reflected as a large difference in vibration amplitude. In a such case, the motion state $U_s$ at the time of switching may not be consistent for each capacitor in the group subject to inspection.

It is preferable that waveform B of a second electric signal is consist of at most several frequency components. In the analysis, it is necessary to separate the transient response components from the vibration response voltage and leave out the components of steady state vibration. If the waveform of the steady state vibration is complex, the separation becomes harder. Further, if a vanilla spectrum analysis is applied to the vibration response voltage, the frequency components of the steady state vibration appear as sharp peaks on a frequency spectrum and become noise in the analysis.

In the inspection method of the present invention, it is preferable that the frequency components constituting a waveform or the waveform frequency $f_0$ are in the range of several 100 kHz to several 10 MHz.

Tone burst signal and FSK signal are examples of electric signals that are generally used and have a signal configuration suitable for the vibration response voltage generating step.

Figure 6:
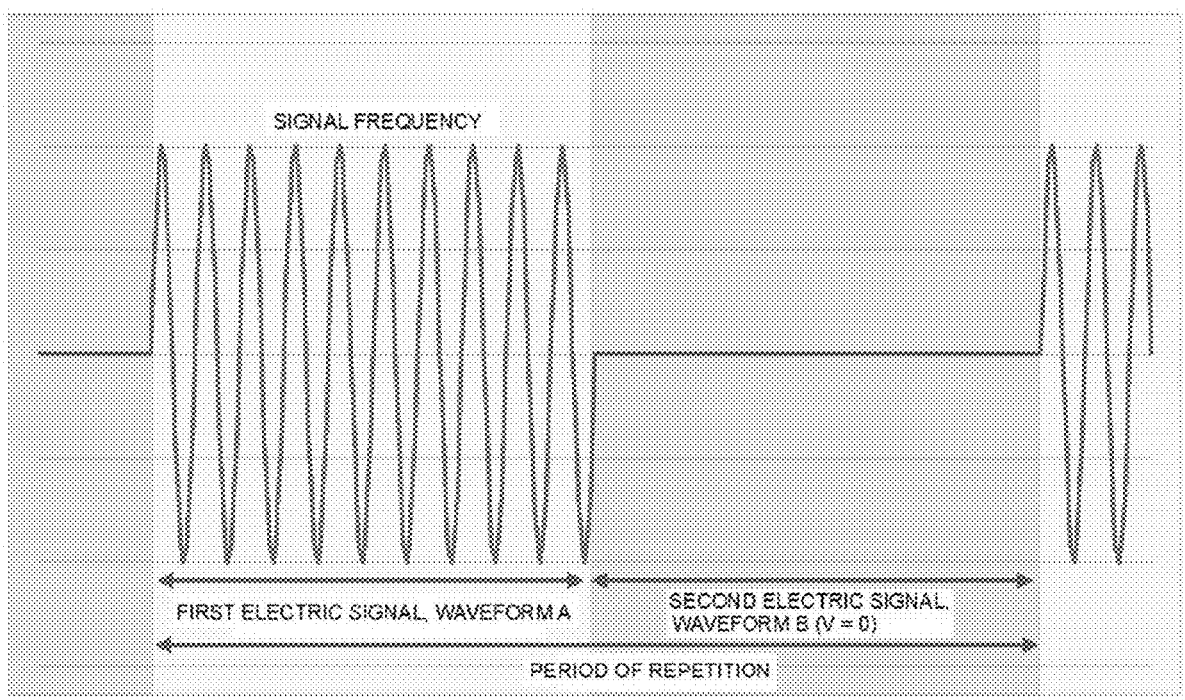
FIG. 6 is a chart showing a signal configuration of a tone burst signal.
Figure 7:
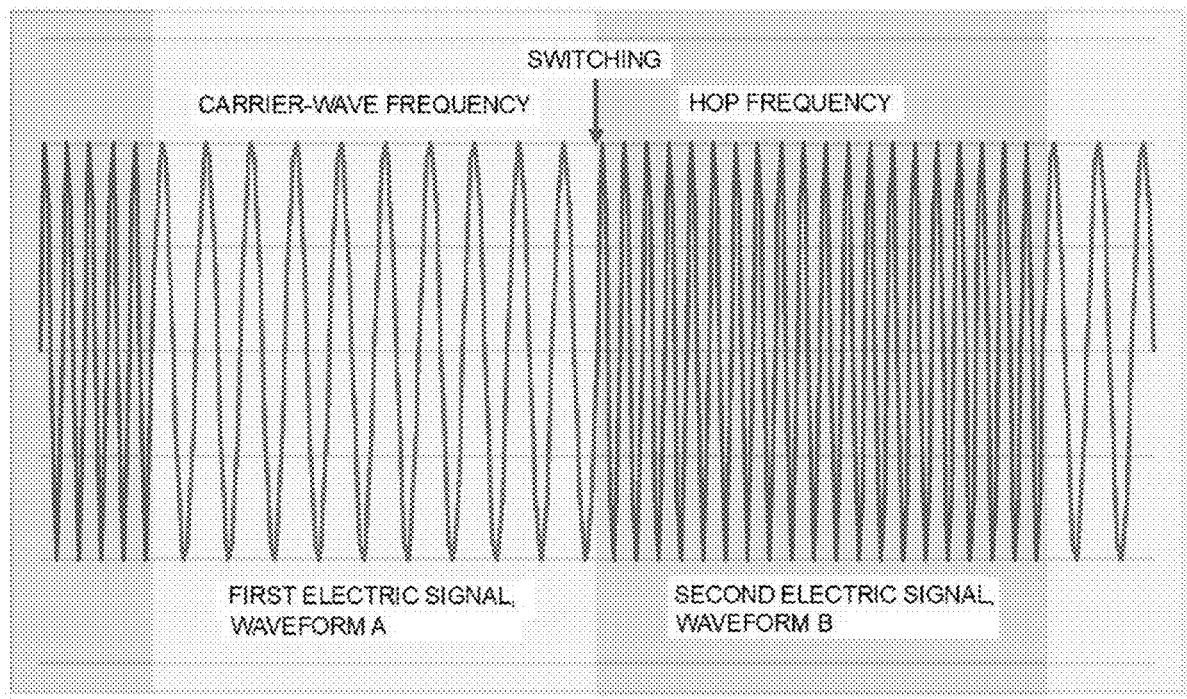
FIG. 7 is a chart showing a signal configuration of an FSK signal.

A tone burst signal is a type of amplitude shift keying (ASK) signal. As shown in FIG. 6, it can be decomposed into a first electric signal of waveform A of the sinusoidal and a second electric signal of waveform B of the DC signal with 0 voltage (a null waveform). A tone burst signal is obtained by alternatively and repeatedly switching the pair of waveforms A and B at a given period, On the other hand, as shown in FIG. 7, the FSK (frequency shift keying) signal is a signal obtained by alternatively and repeatedly switching the pair of waveforms A and B, wherein the waveform A of the first electric signal is a sinusoidal wave, and the waveform B of the second electric signal is a sinusoidal wave of a different frequency.

The present invention is distinguished from the prior art in the use of the electrical signal input to an inspecting capacitor. In the prior art, adjustments on parameters of the input signal waveform are required during a measurement of an inspecting capacitor. Such adjustments include, for example, sweeping the frequency of the electrical signal in a stepwise manner or efforts to search and lock the signal frequency to a normal vibration mode of the capacitor. On the contrary, in the present invention, the inspection method can be formulated in such a way that the waveform parameters of electric signals are fixed and constant during a measurement and are not adjusted for an individual capacitor in the group (defined by product type, lot) subject to inspection.

However, adjustment of the input signal parameters during a measurement or to each capacitor is not a necessary condition for the validity of the inspection method of the present invention. Of course, they can be incorporated as appropriate, and the method of the present invention is still valid.

When the waveform is switched, which normal vibration modes are excited to be observed in the transient vibration depends on the motion state ($U_s$) of the inspecting capacitor at the time of switching, waveform B of the second electric signal after the switching and the strength of coupling between the normal vibration modes. As a general rule, if the input signal of waveform A before switching has frequency $f_A$ and the signal of waveform B after switching has frequency $f_B$, the normal modes with the frequency between $f_A$ and $f_B$ and other modes that are coupled to these modes and with frequency lower than these modes (that is, modes at lower energy band) can be excited to be observed in the transient vibration.

The vibration generated in an inspecting capacitor by a first electric signal or a second electric signal or by the switching of these signals is converted into a voltage with the piezoelectric effect of the electromechanical resonance. When the capacitor is in a steady state vibration, the voltage waveform of vibration generated with the piezoelectric effect has the same periodicity as the waveform of the stress source forcing the vibration (that is, the first electric signal or the second electric signal), and the voltage waveform of vibration is combined onto the waveform of the input electric signal. On the other hand, when a capacitor is in a transient vibration, the voltage waveform of vibration is a mixture of multiple normal modes of vibration of the capacitor. The voltage waveform of vibration further interferes with the waveform of the input electric signal and is output from the capacitor.

In the present invention, the voltage waveform output by a capacitor in which the voltage generated from a vibration or a transient vibration with the piezoelectric effect is combined/interfered with the input electric signal of the stress source is referred to as vibration response voltage.

After the DC bias voltage applying step and the vibration response voltage generating step, a capacitor will output a voltage in which a DC bias voltage and a vibration response voltage are superimposed. In the present invention, this voltage is referred to as a reaction voltage.

(Bridge Load Divider)

In the capacitor inspection method according to the present invention, it is preferred that a load bridge divider comprised of resistors and/or inductors is connected in series with an inspecting capacitor. By adopting a such configuration, the power supplied by the signal generator to the entire measurement circuit is stabilized.

In the inspection method of the present invention, in the vibration response voltage generating step, it is preferable that the electric signal, a first electric signal or a second electric signal, is input to the inspecting capacitor with load impedance adjustment for signal stabilization.

The impedance of a capacitor is inversely proportional to frequency, and the phase of current leads that of voltage by 90°. Therefore, stable driving of a capacitor is difficult if the capacitor is directly connected to a signal generator. The measurement reproducibility is not guaranteed since the input power from the signal generator to the capacitor is likely to be influenced by a minute parasitic resistance, parasitic inductance, or the like.

In the present invention, a suitable circuit configuration is adopted in which a bridge load divider is connected in series with an inspecting capacitor. The bridge load divider reduces the phase difference in voltage and current, and the signal generator can drive the capacitor more easily. The bridge load divider will keep the load impedance of the measurement circuit seen from the signal generator above a certain value regardless of the frequency of the driving signal, then the frequency dependence in the input power is reduced, and the measurement reproducibility can be ensured.

Further, the bridge load divider functions to limit the voltage exerted to a measuring capacitor below a certain value.

The bridge load divider stabilizes the input toward an inspecting capacitor from a first electric signal or a second electric signal, and thus stabilizes the reaction voltage from the capacitor.

In the present invention, functions are not limited for the bridge load divider with the examples given above.

In the present invention, if the output impedance of a power input system, that is, a signal generator and/or a DC voltage supply device, is sufficiently lower than the impedance of an inspecting capacitor in the frequency range of measurement, and if the necessary power can be supplied to the capacitor without a load bridge divider, load bridge divider can be omitted from the configuration of the system.

<Transient Response Waveform Measurement Step>

The transient response waveform measurement step is a step of measuring a transient response waveform from a vibration response voltage. Specifically, in the transient response waveform measurement step, a part of a vibration response voltage corresponding to the transient vibration, which is generated by the signal switching from a first electric signal to a second electric signal and is contained in a reaction voltage, is extracted as a transient response waveform.

(Separation of Vibration Response Voltage by Filtering Process)

In the inspection method of the present invention, after a DC bias voltage applying step and a vibration response voltage generating step, it is preferable that a filtering process is performed with a filter circuit to the reaction voltage that is output from an inspecting capacitor. Specifically, a filtering process separates and remove the DC bias voltage component from the reaction voltage to expose a vibration response voltage.

The suitable filter circuit, for example, is a high-pass filter circuit connected in parallel to an inspecting capacitor. The filter circuit can separate and remove the DC bias voltage component from a reaction voltage to expose a minute vibration response voltage.

The filter circuit also serves to separate the measurement terminal of the measurement system from the input terminal of an electric signal. The measurement contacts are placed on a filter element, and thus, the measurement contacts are separated from the input terminal of the holder portion via filter elements. With this configuration, a large current does not flow through the measurement terminal when an electric signal is input, and it suppresses the adverse effects of the contact resistance or of the line inductance on the measurement values.

If an RC high-pass filter is used for a filter circuit, the cutoff frequency of the filter, $1/2\pi\tau$ where $\tau=RC$, needs to be lower than the lowest measurement frequency. Further, to prevent the input impedance of the filter from altering the current flowing through an inspecting capacitor, the filter resistance needs to be sufficiently higher than the impedance of the inspecting capacitor in the frequency range of measurement.

The measurement system normally measures a signal in voltage. Alternatively, current can be used as a measurement medium for vibration response voltage by inserting an ammeter in series with the filter circuit or the filter capacitor. This is because voltage applied on the filter resistor and the current flowing through the filter circuit is directory proportional, and there is no practical difference in the information that can be obtained with either current or voltage is used as the measurement medium.

(Extracting a Transient Response Waveform)

In the measurement of a vibration response voltage, the reference time point of the measurement system is set to the time ($t=t_s$) corresponding to the switching of the input signal from a first electric signal to a second electric signal. A vibration response voltage of an inspecting capacitor is measured with the reference time to capture the transient response in the vibration response voltage.

In a regular setup, in the measurement of vibration response voltage, the measurement trigger of the voltage/current measuring device is set to a switching signal synchronized with the switching of electric signals. Alternatively, a vibration response voltage and a signal synchronized with the switching of the electric signals can be measured simultaneously. In such ways, a transient response can be identified in the reaction voltage of an inspecting capacitor, and the transient response waveform can be extracted.

(Extraction and Analysis of a Transient Response Waveform Generated with an FSK Signal, an Example)

An example of measurement and analysis is given below. In this example, the first electric signal is set to a sinusoidal wave of frequency 1100 kHz, the second electric signal is set to another sinusoidal wave of frequency 2200 kHz, and the two signals are periodically and alternatively switched. This signal configuration is generally referred to as FSK signal.

Figure 8:
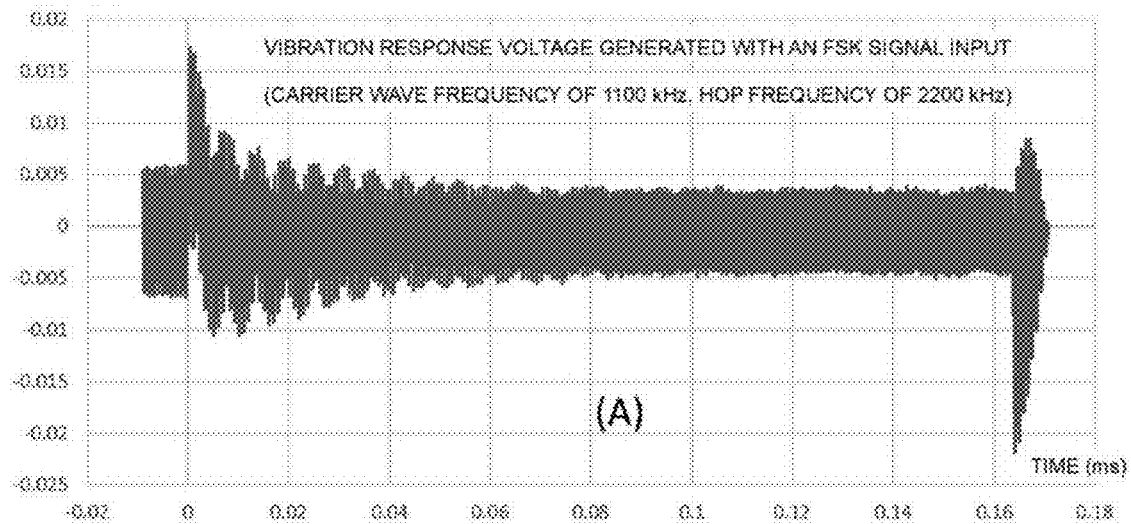
Figure 8:
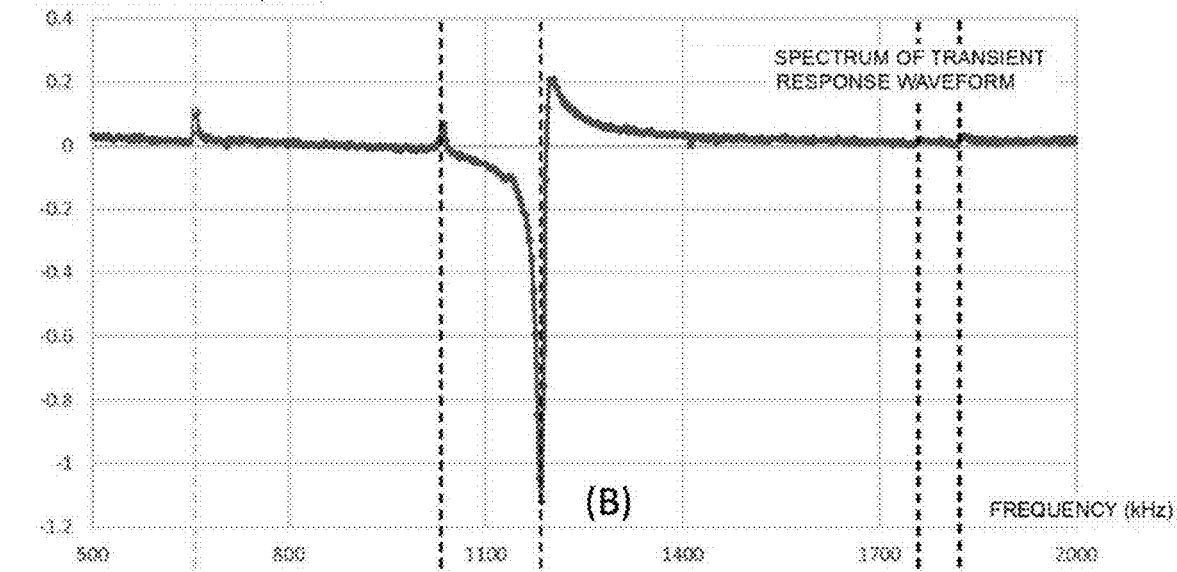
Figure 8:
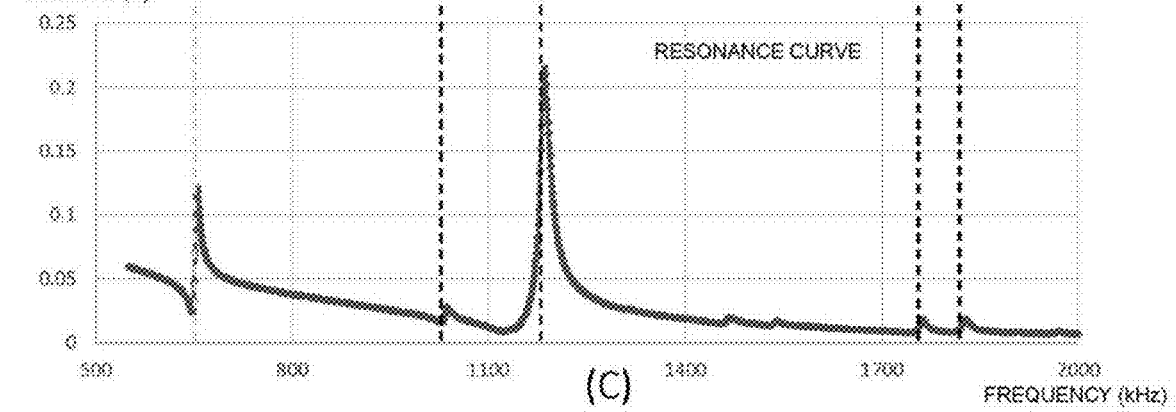

FIG. 8(A) shows the vibration response voltage of a capacitor when the first electric signal (carrier wave) of 1100 kHz is switched to the second electric signal (hop wave) of 2200 kHz, FIG. 8(B) shows the frequency spectrum distribution of a transient response waveform extracted from the vibration response voltage, and FIG. 8(C) is a reference resonance curve of a non-defective capacitor for comparison. The electric signal switching time $t_s$ corresponds to the reference time (0 s) of the measurement.

FIG. 8(A) shows an exponential convergence of the vibration response voltage of capacitor to a steady vibration of 2200 kHz after the input electric signal is switched to a second electric signal of 2200 kHz.

FIG. 8(B) shows the frequency spectrum of the transient response waveform in the measured vibration response voltage. The spectrum distribution contains peaks that are different from either of the input signal frequencies 1100 kHz or 2200 kHz, but they coincide with the peaks on the resonance curve. It can be concluded that the information on resonance characteristics of capacitor is contained in the transient response portion of a vibration response voltage. Further, in the spectrum distribution of the transient response waveform, not only the primary peak at 1190 KHz band but also the peaks at 1780 KHz band and 1840 KHz band can be confirmed. It is shown that the information obtained from a frequency spectrum of the transient response waveform is sensitive to a wide range of frequency up to 2200 kHz.

(Extraction and Analysis of a Transient Response Waveform Generated with a Tone Burst Signal, an Example)

In this example, the first electric signal is set to a sinusoidal wave of a frequency of 1240 KHz, the second electric signal is set to V=0 (a null signal), and the two signals are periodically and alternatively switched. Generally, this signal configuration is referred to as tone burst signal.

Figure 9:
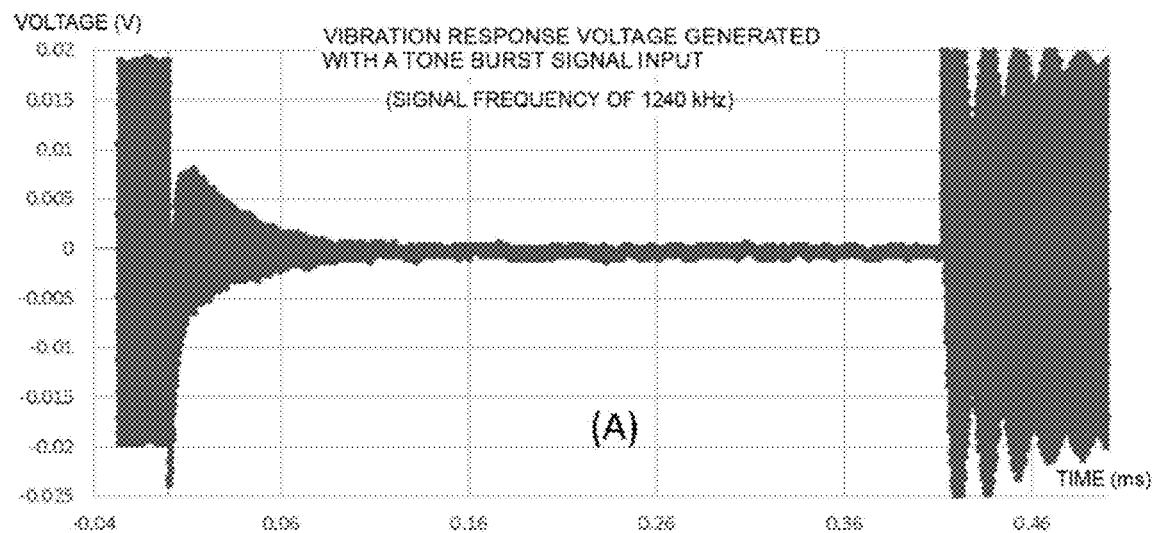
Figure 9:
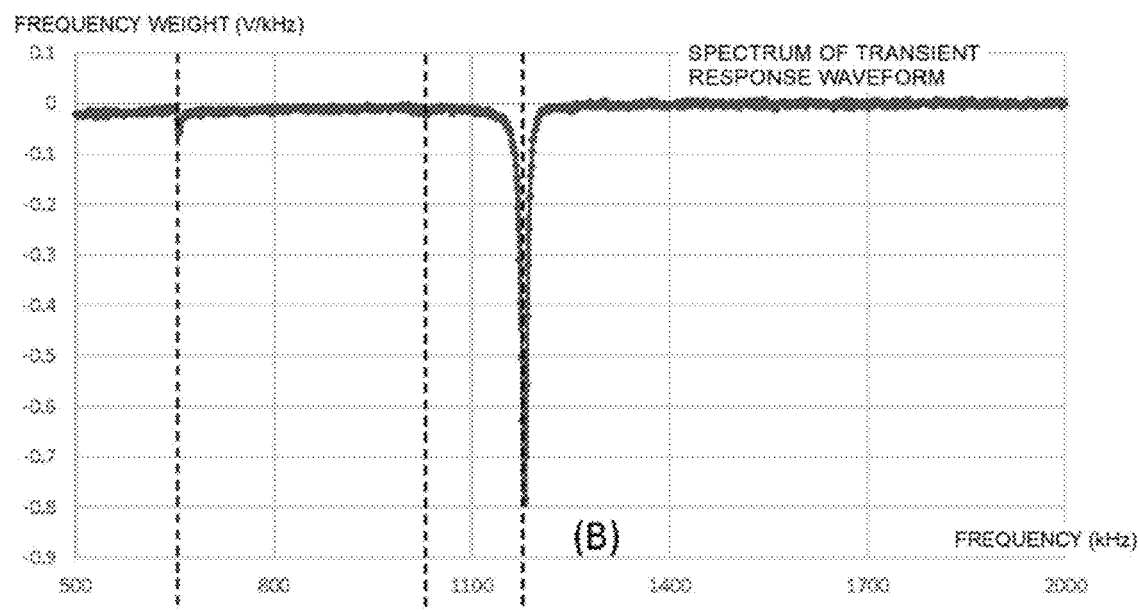
Figure 9:
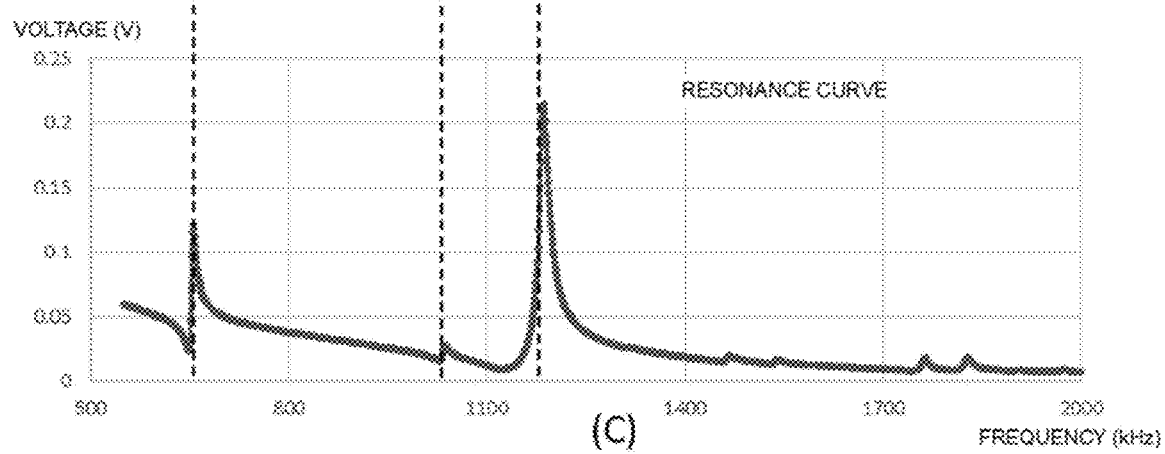

FIG. 9(A) shows a vibration response voltage of a capacitor after the input signal is switched from the first electric signal to the second electric signal. FIG. 9(B) shows the frequency spectrum of a transient response waveform extracted from the vibration response voltage. FIG. 9(C) is a reference resonance curve of a non-defective capacitor for comparison.

It can be confirmed from FIG. 9(A) that after the input signal is switched to a null signal, the capacitor is set to a free oscillation, and the vibration of the capacitor is exponentially damped. In FIG. 9(B), the spectrum distribution of the free oscillation shows that the capacitor vibrates in a mixture of its own normal vibration modes. In the spectrum distribution, peaks at 1190 KHz band, 1050 kHz band and 650 KHz band can be confirmed. It is shown that the spectrum distribution contains information sensitive to the frequency range from 1240 kHz to 0 Hz.

(Extraction and Analysis of a Transient Response Waveform with Two-Frequency Mixed Wave Burst, an Example)

In this example, the first electric signal is set to a mixed sinusoidal wave of frequencies 682 kHz and 1202 kHz, the second electric signal is set to V=0 (a null signal), and the two signals are periodically and alternatively switched.

Figure 10:
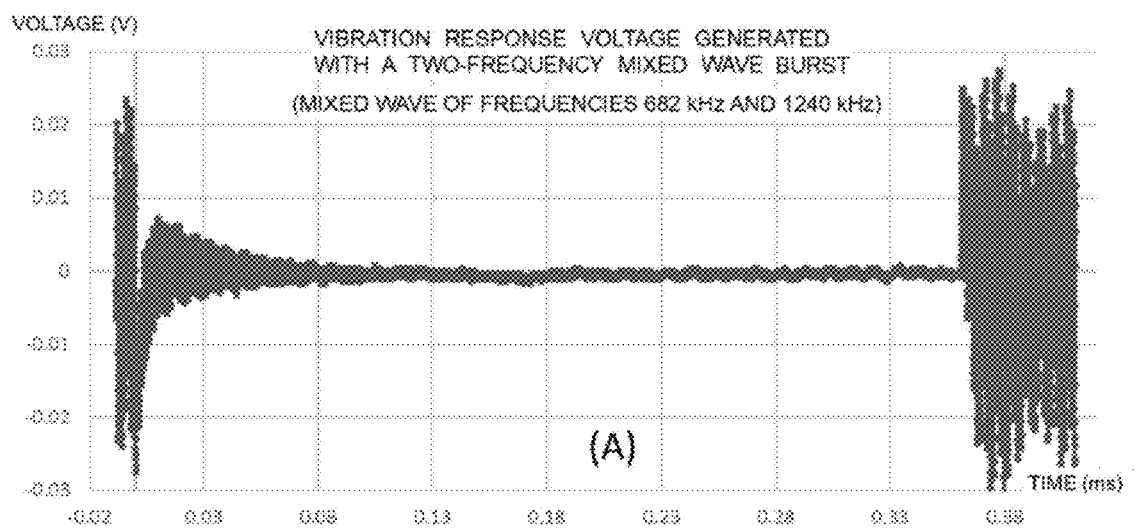
Figure 10:
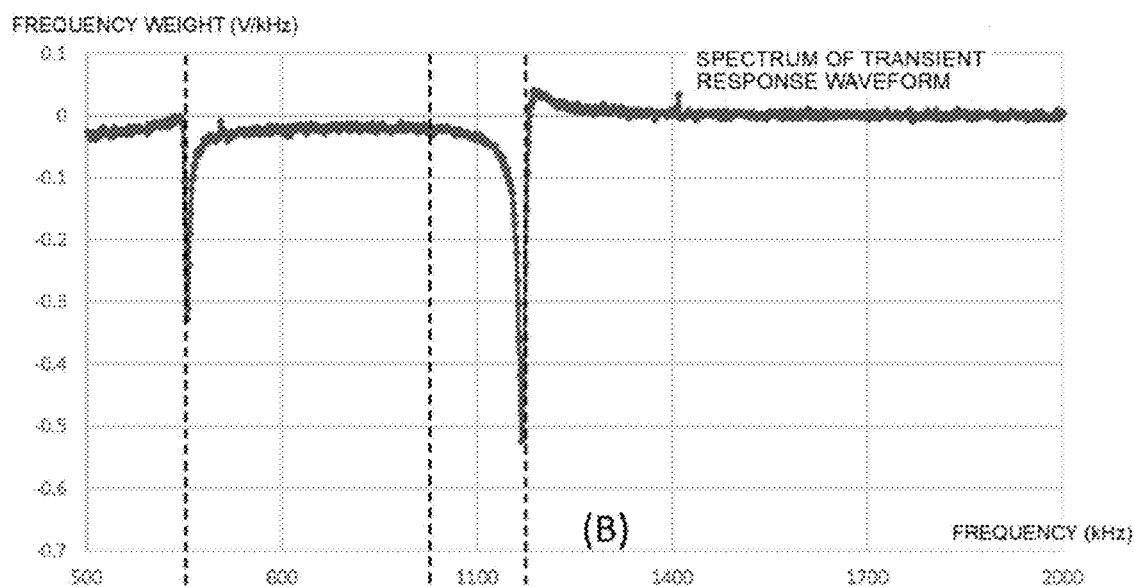
Figure 10:
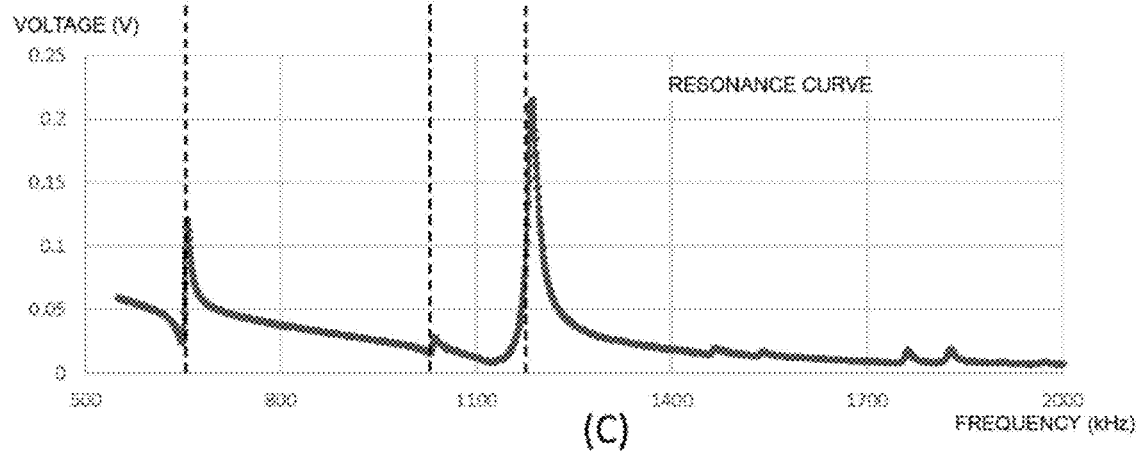

FIG. 10(A) shows a vibration response voltage of a capacitor after the input signal is switched from the first electric signal to the second electric signal. FIG. 10(B) shows the frequency spectrum of a transient response waveform extracted from the vibration response voltage. FIG. 10(C) is a reference resonance curve of a non-defective capacitor for comparison.

In the spectrum distribution of the transient response waveform, peaks at 1190 kHz band and 650 kHz band can be confirmed. Compared to the examples using an FSK signal or a tone burst signal, the peak at 650 kHz band is excited more strongly, thus it has higher sensitivity to the low frequency range.

From the measurement and analysis examples above, it can be concluded that a transient response waveform, which is generated by switching the input electric signal from a first electric signal to a second electric signal and is extracted from a vibration response voltage, contains information on the normal vibration modes of a capacitor and the characteristics thereof across a wide range of frequency.

(Measurement Speed)

In the inspection method of the present invention, by the principle of the method, the only constraint to the measurement speed is the time for a transient response to settle into a steady state vibration, and thus a very fast measurement can be done. The time to settle into a steady state vibration varies depending on the type and size, etc. of the capacitor, though normally it is less than 1 ms. This means the maximum time required for one measurement is at most 2 ms, even when settling into a steady state is imposed for both switching from the first electric signal to the second electric signal and vice versa in a periodic switching.

<Quality Determination Step>

The inspection method of the present invention may include a quality determination step of determining the quality of an inspecting capacitor.

In a quality determination step, the quality of an inspecting capacitor is determined from a transient response waveform measured in the transient response waveform measurement step, (that is, the transient response waveform generated from the inspecting capacitor), and the criteria for acceptance or rejection will be based on the differences in waveform characteristics between those of non-defective capacitors and those of defective capacitors.

Specifically, in a quality determination step, a defective capacitor can be identified from information contained in a transient response waveform such as amplitude, oscillation frequencies, the speed of damping, and the interference of normal vibration modes.

Figure 11:
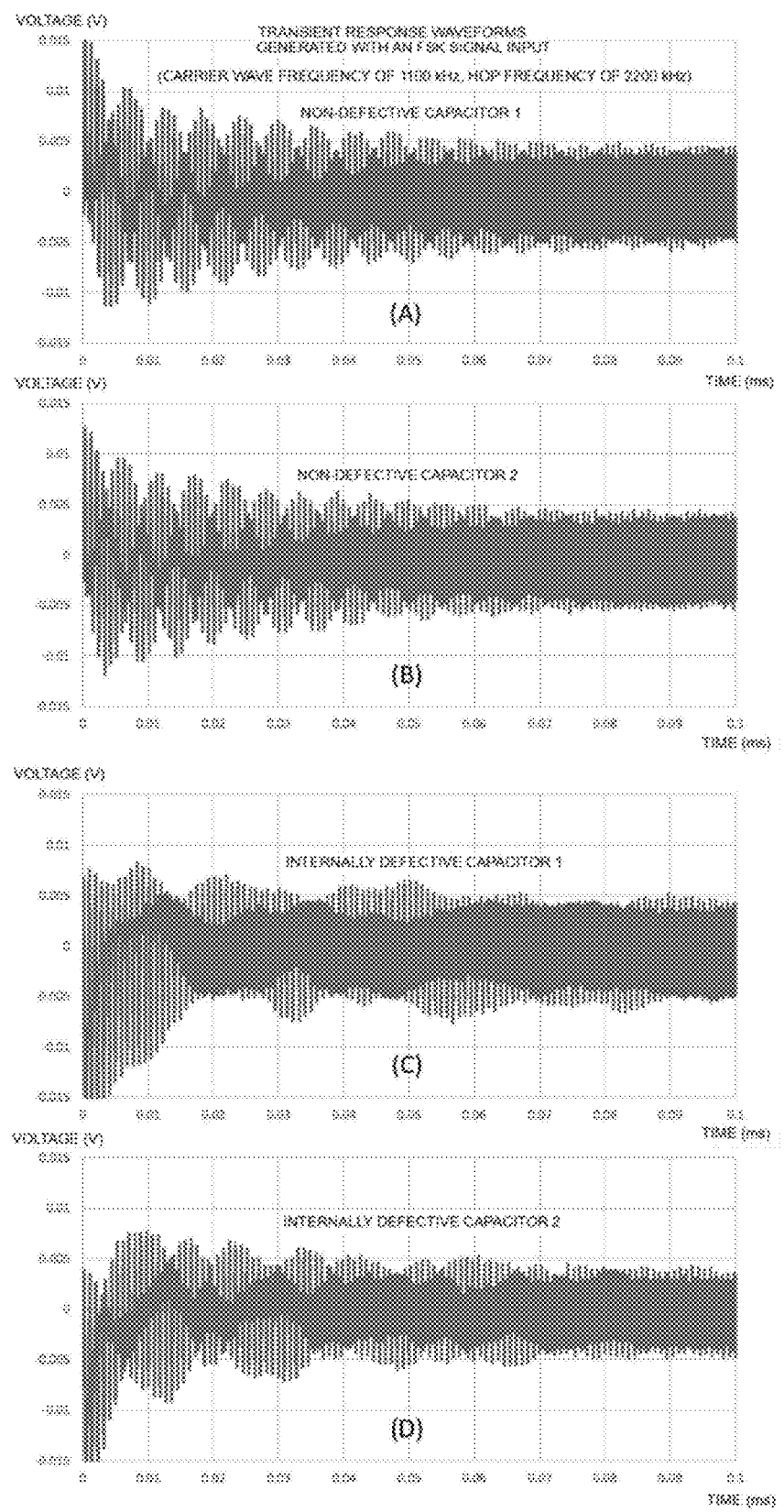
FIG. 11 shows transient response waveforms of non-defective capacitors and internally defective capacitors when an FSK signal is input.

FIG. 11 shows a comparison on the characteristics of transient response waveforms between a non-defective capacitor and a defective capacitor (internally defective capacitor). Measurements are performed using an FSK signal with the first electric signal is set to a sinusoidal wave of frequency 1100 kHz and the second electric signal is set to a sinusoidal wave of frequency 2200 kHz.

The difference between non-defective capacitor and defective capacitor is immediately apparent, especially in the pattern of interference of the normal vibration modes with the input signal (that is, a beat phenomenon). In FIGS. 11(A) and 11(B) of non-defective capacitors, clear beats with a constant period are confirmed. However, in FIGS. 11(C) and 11(D) of defective capacitors, the beats are in longer periods and the periods unstably fluctuate.

As shown, characteristics of the transient response waveforms are different for defective capacitors from those of non-defective capacitors.

The methodology of quality determination, in the quality determination step, requires comparison in the characteristics of a transient response waveform measured from the subject capacitor with those of non-defective capacitors and/or those of defective capacitors. The sets of transient response waveforms of non-defective capacitors and of defective capacitors can be prepared prior to inspection, by following the same steps of measurement as described in the present invention.

The transient response waveforms can be analyzed with a windowed Fourier transform or a wavelet transform technique. With these techniques, the resonance characteristics of an inspecting capacitor can be mapped as a frequency spectrum in each given time window.

When a Fourier transform is performed, for example, peaks in the spectrum distribution of a non-defective capacitor appear sharply with high Q values at the normal mode frequencies for non-defective capacitor. In the case of a defective capacitor, peaks in the spectrum distribution manifest different characteristics. They may be degraded into low Q values, divided into multiple peaks, or accompanied by secondary peaks.

Thus, an abnormality due to capacitor's defect can be detected with a such a characteristic analysis, and the acceptability of an inspecting capacitor can be determined.

The apparatus for implementing the capacitor inspection method of the present invention will be described in detail below.

The preferred and basic apparatus configuration for the capacitor inspection method of the present invention comprises a holder portion for an inspecting capacitor, a DC voltage supply device connected to the input side of the holder portion, a signal generator connected to the input side of the holder portion, and a voltage/current measuring device connected to the output side of the holder portion.

It is preferable that the capacitor inspection apparatus further comprises a bridge load divider connected in series between the holder portion and the signal generator, and a filter circuit connected in parallel to the holder portion.

Figure 12:
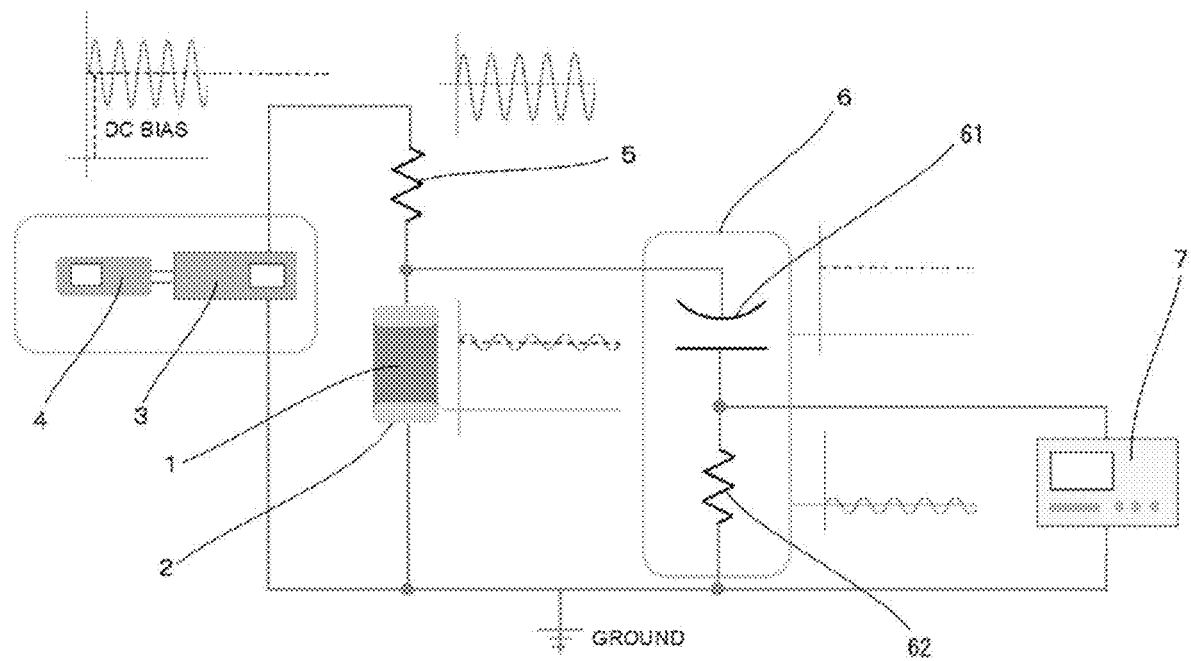
FIG. 12 is a schematic diagram showing a basic apparatus configuration for the capacitor inspection method of the present invention.

FIG. 12 shows a schematic configuration of one embodiment of the capacitor inspection apparatus of the present invention.

The inspection apparatus of the present embodiment includes a holder portion 2 for a capacitor 1 subject to inspection, a DC voltage supply device 3, a signal generator 4, a bridge load divider 5, a filter circuit 6, and a voltage/current measuring device 7.

(Holder Portion)

Holder portion 2 is an inspection stage for Capacitor 1, on which the terminal electrodes of Capacitor 1 make electrical contacts with the external devices or the external circuits. The size, shape, and the like of Holder portion 2 can be adjusted appropriately in accordance with the type, size, and the like of Capacitor 1.

(DC Voltage Supply Device)

DC voltage supplying device 3 applies a DC bias voltage to Capacitor 1. The types of power supply that can be used for the apparatus are not limited provided it can supply the specified bias voltage equal to or lower than the rated voltage of Capacitor 1. For example, DC voltage supplying device 3 can be a storage battery, a stabilized power supply, a device capable of generating a rectangular wave having a relatively long span, or a function generator that creates a voltage waveform having a sufficiently small change in value within a measurement time.

(Signal Generator)

Signal generator 4 is a device for inputting a first electric signal and a second electric signal to Capacitor 1 subject to inspection. Any signal generators cay be used as Signal generator 4 provided it is a device capable of outputting, switching, or superimposing various voltage signals having specified frequencies. Specifically, a function generator can be suitably used.

(Bridge Load Divider)

Bridge load divider 5 is a circuit connected in series between the holder portion 2 and the signal generator 4. The circuit is constructed, for example, from resistors and/or inductors. Bridge load divider 5 is inserted to provide load impedance adjustment for a first electric signal and a second electric signal. It reduces the phase difference between current and voltage of Signal generator 4 to facilitate a stable driving of capacitor, and it in turn stabilizes the reaction voltage. Here, impedance |Zb| of Bridge load divider 5 is required to be sufficiently larger than impedance |Zc| of Capacitor 1 subject to measurement.

(Filter Circuit)

Filter circuit 6 is a high-pass filter circuit connected in parallel to Holder portion 2. It removes the DC bias voltage from a reaction voltage of Capacitor 1 to single out a vibration response voltage. Filter circuit 6 can be a RC high-pass filter circuit constituted of Filter capacitor 61 and Filter resistor 62. When Voltage/current measuring device 7 measures in voltage, one end of Filter resistor 62 is grounded.

(Voltage/Current Measuring Device)

Voltage/current measuring device 7 extracts and measures the transient vibration components from a vibration response voltage. Any measurement devices can be used provided that the measurement device can set a measurement trigger on a switching signal that is synchronized with the switching of the input electric signals, or it can simultaneously measure multiple signals on the same time axis. For example, a commercial oscilloscope can be used. Further, a spectrum analyzer or a signal analyzer may be used as Voltage/current measuring device 7, and in this case, the measurement output is directly a frequency spectrum of a transient response waveform.

From the measured transient response waveform, a defect of Capacitor 1 can be detected with a high reliability.

The above embodiment of the inspection apparatus is configured with Capacitor 1 subject to inspection, Holder portion 2 for mounting Capacitor 1, a signal input system consist of DC voltage supply device 3 for applying a DC bias voltage and Signal generator 4 for generating an electric signal, Bridge load divider 5 for load impedance adjustment to keep the load impedance seen from the signal input system constant, Filter circuit 6 connected in parallel to Capacitor 1 subject to inspection, and Voltage/current measuring device 7 for measuring the response of Capacitor 1 through Filter circuit 6. This apparatus configuration is simple, and the entire inspection system can be configured at a low cost and in a small space.

The capacitor inspection method and the capacitor inspection apparatus of the present invention have been explained, though the scope of the present invention is not limited by the above-described embodiments. Various changes can be made to the embodiments not departing from the gist of the present invention.

For example, although electronic components subject of inspection have been described as capacitors in the above-described embodiments, the present invention, in principle, can be applied to inspect other electronic components such as ferrite beads or laminated batteries which have electrodes and made of dielectric material.

INSPECTION EXAMPLES

The capacitor inspection method of the present invention will be described in more detail below with concrete inspection examples. However, the scope of the present invention is not limited to the following examples.

<Experimental Sample>

The experiment samples are comprised of 500 multilayer ceramic capacitors (MLCC) having a shape of 3.2 mm in length, 1.6 mm in height, 1.6 mm in width, capacitance of 10 µF, rated voltage of 35 V, and temperature characteristic of X5R. The samples have the same product number, and they are commercially available.

(Non-Defective Group)

A non-defective group includes 76 capacitors randomly sampled from the experimental samples. In order to obtain indicators of non-defective products, the resonance curves of the capacitors of the non-defective group are measured under defined conditions, and the peak frequencies and peak values in 1190 KHz band, which correspond to the primary peaks, are obtained. For the non-defective group, the mean peak value and the standard deviation were 0.210 V±0.013 V, and the mean peak frequency and the standard deviation were 1191.6 kHz±4.1 KHz.

(Internally Defective Capacitors)

From the experimental samples, capacitors are collected into four groups each consists of 42 samples. Different types of stress are respectively applied to each group in attempt to create defects in the capacitors. The applied stress for each group is listed as follows.

Group I) rapid heating: from a room temperature, immerse a capacitor into liquid nitrogen (−196° C.), and after the temperature is stabilized, immerse the capacitor in a liquid metal (350° C.) to apply a thermal shock to the capacitor. This is repeated three times.

Group II) heat quench: from a room temperature, place a capacitor on a liquid metal (350° C.) to heat the capacitor, and after the temperature is stabilized, immerse the capacitor in liquid nitrogen to apply a thermal quench shock to the capacitor. This is repeated twice.

Group III) physical impact: fix the terminal electrodes of the capacitor from above and below by metal jigs, and drop a cylindrical metal fitting having a weight of 31 g by free fall from a height of 10 cm to bring the bottom surface of the metal fitting into contact with the jigs. This is repeated twice.

Group IV) physical impact by iron ball: fix the terminal electrodes of the capacitor from above and below by metal jigs, and drop an iron ball having a weight of 28 g by free fall from a height of 9 cm to make contact with the jigs. This is repeated twice.

After applying the stresses, the resonance curves of the capacitors of Groups I to IV are measured with a conventional technique of electromechanical resonance with step frequency sweep, and the capacitors having a peak value of 0.170 V or less in the 1190 KHz band are identified as defective.

The defective capacitors are then visually inspected by an inspector, and the defective capacitors whose defects appear to the outside are classified as externally defective capacitors, and those without outside defects under the visual inspection are classified as internally defective capacitors.

The number of capacitors classified as internally defective is 11 in Group I, 17 in Group II, 7 in Group III, and 10 in Group IV.

<Device Configuration and Settings>

In the following examples, in accordance with FIG. 12, the apparatus is configured with a bridge resistor as the bridge load divider, an oscilloscope (Agilent InfiniiVision DSO-X-3024A) as the voltage/current measuring device, and an RC high-pass filter circuit having a cutoff frequency of 50 kHz as the filter circuit. Measurements are taken with the DC bias voltage set to 12.0 V.

Inspection Example 1: Identification of Internally Defective Capacitors with FSK Signal In Inspection Example 1, an FSK signal is used as the input signal. The first electric signal is designated to the carrier wave sinusoidal of frequency 975 kHz of FSK, whereas the second electric signal is designated to the hop wave sinusoidal of frequency 2925 kHz of FSK. The vibration response voltage from the non-defective capacitors and the internally defective capacitors are measured.

Figure 13:
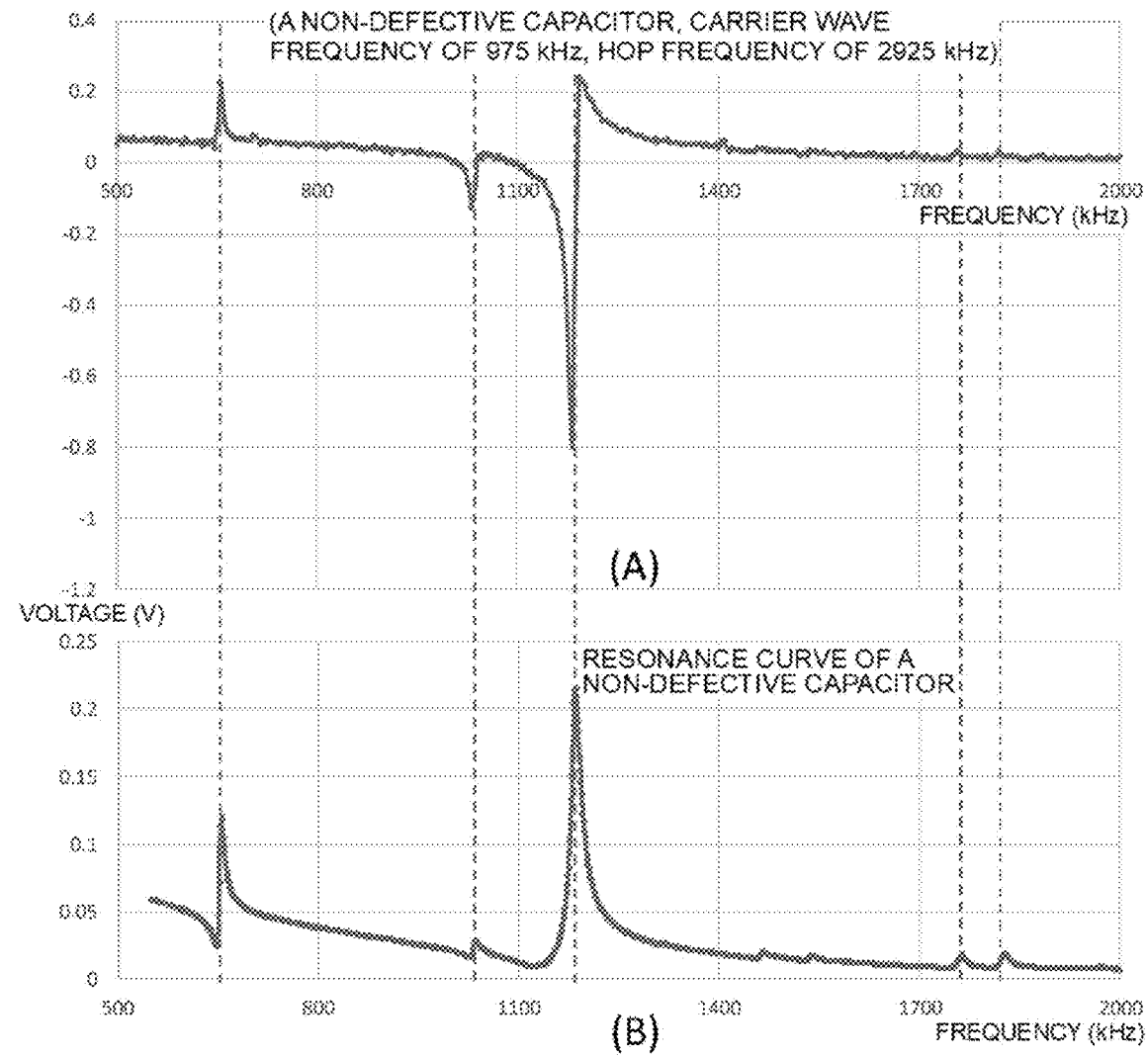
FIG. 13(A) is a spectrum distribution for a non-defective capacitor measured in Inspection Example 1.
FIG. 13(B) is a resonance curve of a reference non-defective capacitor measured with a step frequency sweep.

FIG. 13(A) shows a frequency spectrum of a transient response waveform of a non-defective capacitor, and FIG. 13(B) shows a reference resonance curve of a non-defective capacitor measured with step frequency sweep.

In the spectrum distribution of a non-defective capacitor shown in FIG. 13(A), a sharp and dominant peak appears at slightly below 1190 kHz, in agreement with the resonance curve. Relatively small peaks are also observed at around 650 kHz, 1040 kHz, and in higher frequency range, again in agreement with normal mode frequencies shown in the resonance curve. No peak of significance is observed at other frequencies.

Figure 14:
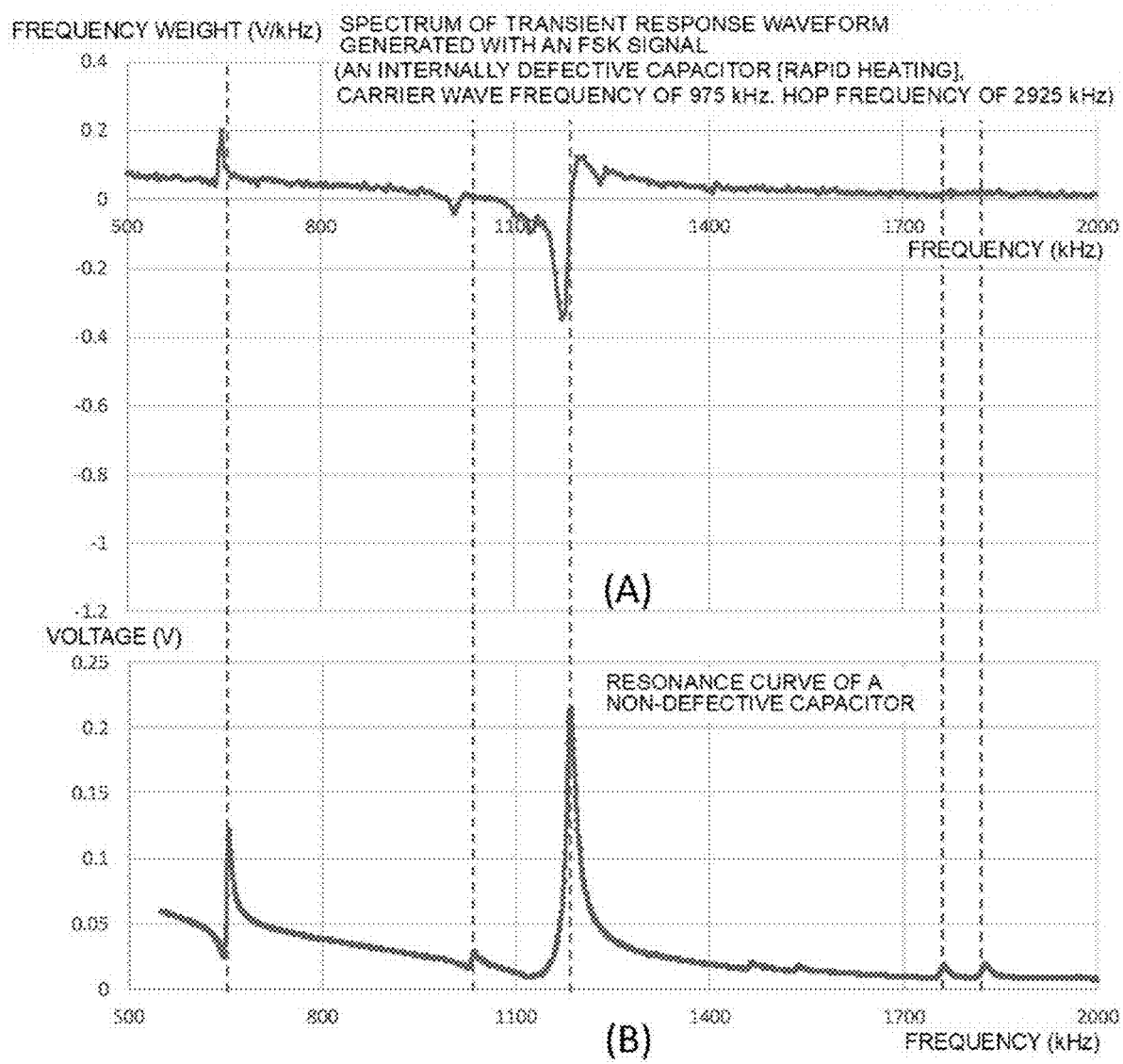
FIG. 14(A) shows a spectrum distribution for an internally defective capacitor (group I) measured in Inspection Example 1.
FIG. 14(B) shows a resonance curve of a reference non-defective capacitor measured with a step frequency sweep.
Figure 15:
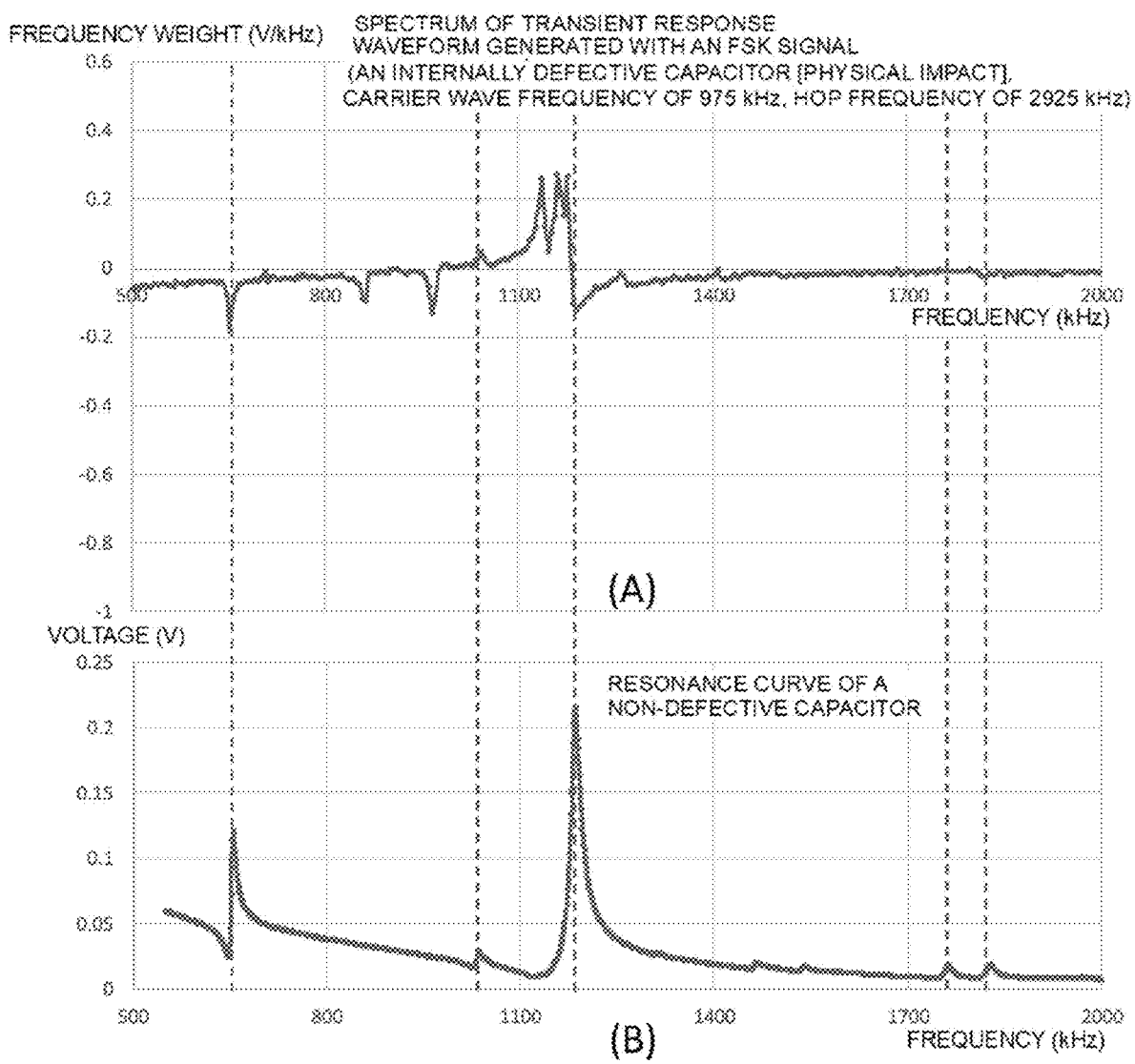
FIG. 15(A) shows a spectrum distribution for an internally defective capacitor (group III) measured in Inspection Example 1.
FIG. 15(B) shows a resonance curve of a reference non-defective capacitor measured with a step frequency sweep.

FIGS. 14(A) and 15(A) show frequency spectra obtained from the transient response waveforms of internally defective capacitors, and FIGS. 14(B) and 15(B) show resonance curves of a non-defective capacitor as reference.

FIG. 14(A) is a spectrum distribution of an internally defective capacitor of group I (rapid heating). An overall tendency for resonance peaks to shift to lower frequency can be observed. The height of each peak is lowered for a low Q value. Further, secondary peaks separate from the primary normal vibration modes are observed.

FIG. 15(A) is a spectrum distribution of an internally defective capacitor of group III (physical impact). The primary peak (in 1190 KHz band) is divided, and clear secondary peaks are observed between 650 kHz and 1190 KHz.

Next, the datasets ($f_p$, Q) are constructed from spectra of the transient response waveforms obtained in the above measurement where $f_p$ is a peak value of the primary peak (at 1190 KHz band) and Q represents the sharpness of the primary peak (Q value). In computing Q, the second order differential of the frequency spectrum (W) at the peak frequency, $Q=d^2 W/df^2|f=f_p$, is used.

Figure 16:
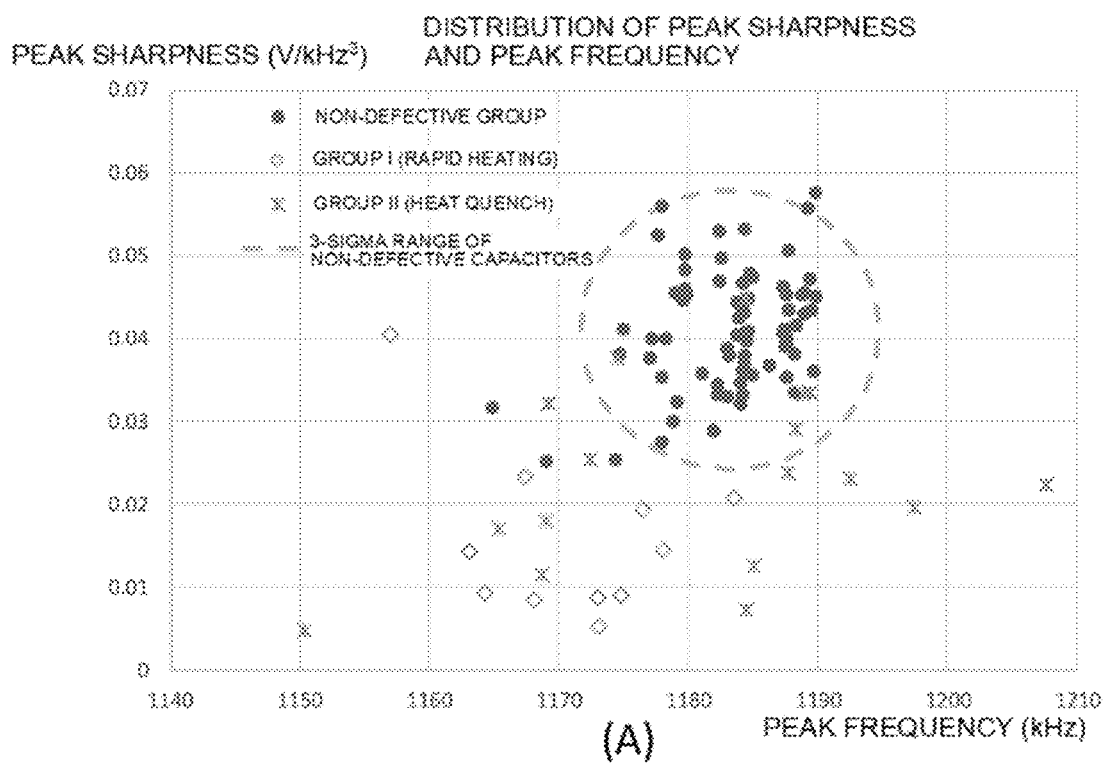
FIG. 16 is a classification plot of Inspection Example 1 with an example acceptance range. The values of peak sharpness and peak frequency found in the spectrum distributions of the non-defective capacitors and the internally defective capacitors (groups I to IV) are plotted. The dotted line in an ellipse represents a 3-sigma range of the non-defective capacitors.
Figure 16:
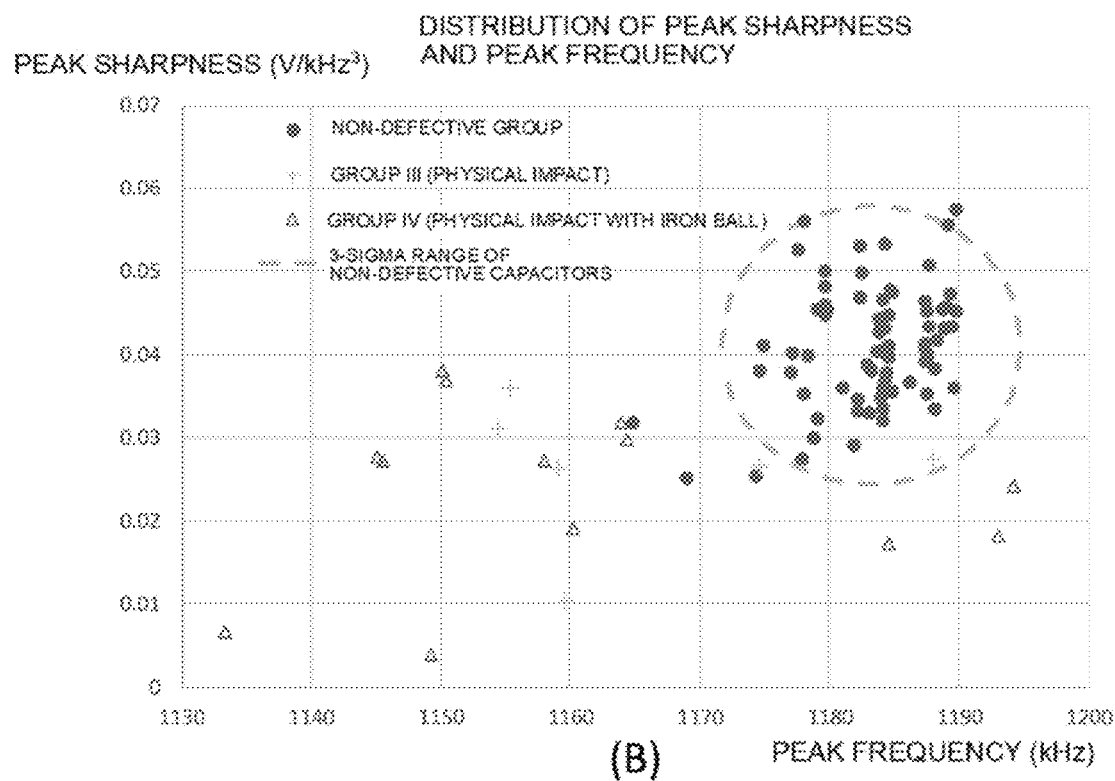

FIGS. 16(A) and 16(B) show plots of the datasets labeled in non-defective group and each internally defective group (groups I to IV). The dotted line in ellipse represents a 3-sigma range of non-defective capacitors assuming that peak frequency and peak sharpness are independent parameters, and both are normally distributed.

It can be observed from the plots that the peak frequencies and the Q values of non-defective capacitors of are each concentrated around 1180 kHz to 1190 KHz and 0.03 V/KHz$^3$ to 0.06 V/KHz$^3$, respectively, whereas for defective capacitors, peak frequencies are dispersed, and peaks have low Q values.

It is also confirmed that all but five capacitors from group II and one from group III are outside the 3-sigma range.

Inspection Example 2: Identification of Internally Defective Capacitors with Tone Burst Signal Next, in Inspection Example 2, the vibration response voltage of the internally defective capacitors is measured by a tone burst signal with the signal frequency set to 1300 KHz.

Figure 17:
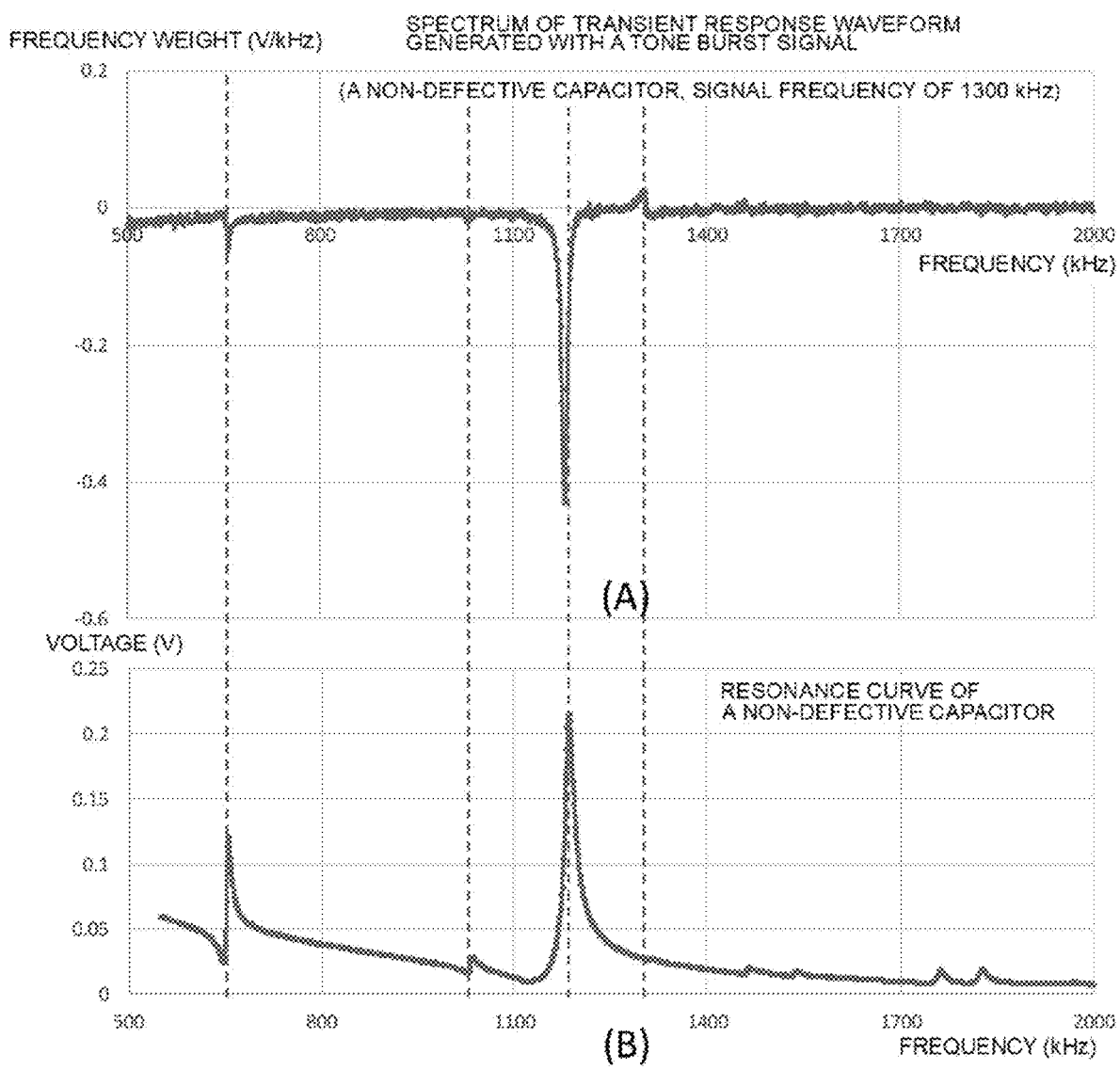
FIG. 17(A) is a spectrum distribution for a non-defective capacitor measured in Inspection Example 2.
FIG. 17(B) is a resonance curve of a reference non-defective capacitor measured with a step frequency sweep.

FIG. 17(A) shows the frequency spectrum of a transient response waveform of a non-defective capacitor, and FIG. 17(B) shows a resonance curve of a non-defective capacitor measured with step frequency sweep as reference.

In the spectrum distribution of the non-defective capacitor, a sharp and dominant primary peak appears at slightly below 1190 kHz, in agreement with the resonance curve. Relatively small peaks are also observed at around 650 kHz, 1040 kHz, and at higher frequency range around 1300 kHz, again in agreement with frequencies of the normal modes shown in the resonance curve. No other peak of significance is observed at other frequencies.

Figure 18:
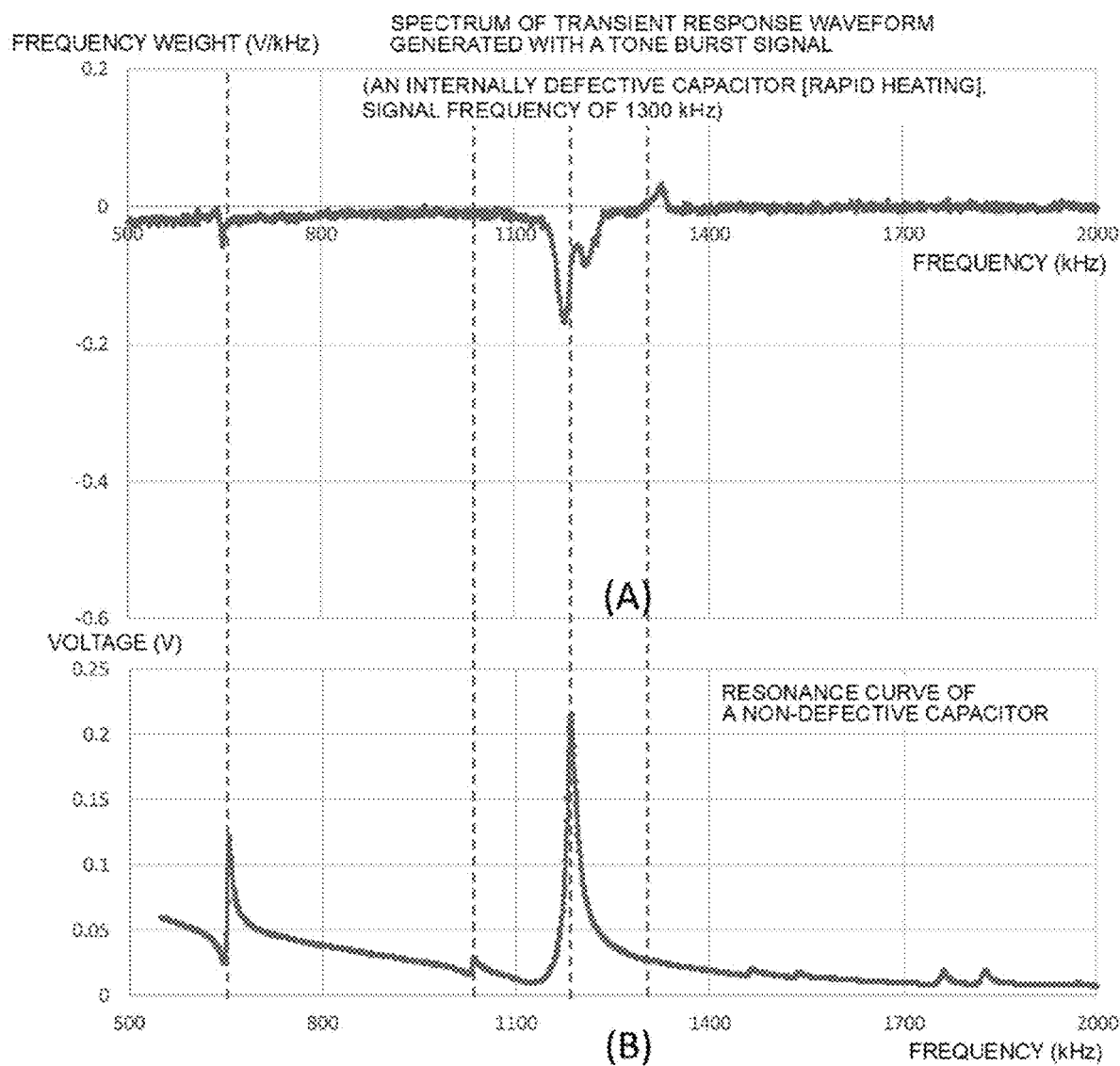
FIG. 18(A) shows a spectrum distribution for an internally defective capacitor (group I) measured in Inspection Example 2.
FIG. 18(B) shows a resonance curve of a reference non-defective capacitor measured with a step frequency sweep.

FIG. 18(A) is the spectrum distribution of an internally defective capacitor of group I (rapid heating). FIG. 18(B) shows a resonance curve of a non-defective capacitor as reference. It is evident that the frequency of the primary peak corresponding to 1190 KHz band is lower, and the peak height is significantly reduced.

Figure 19:
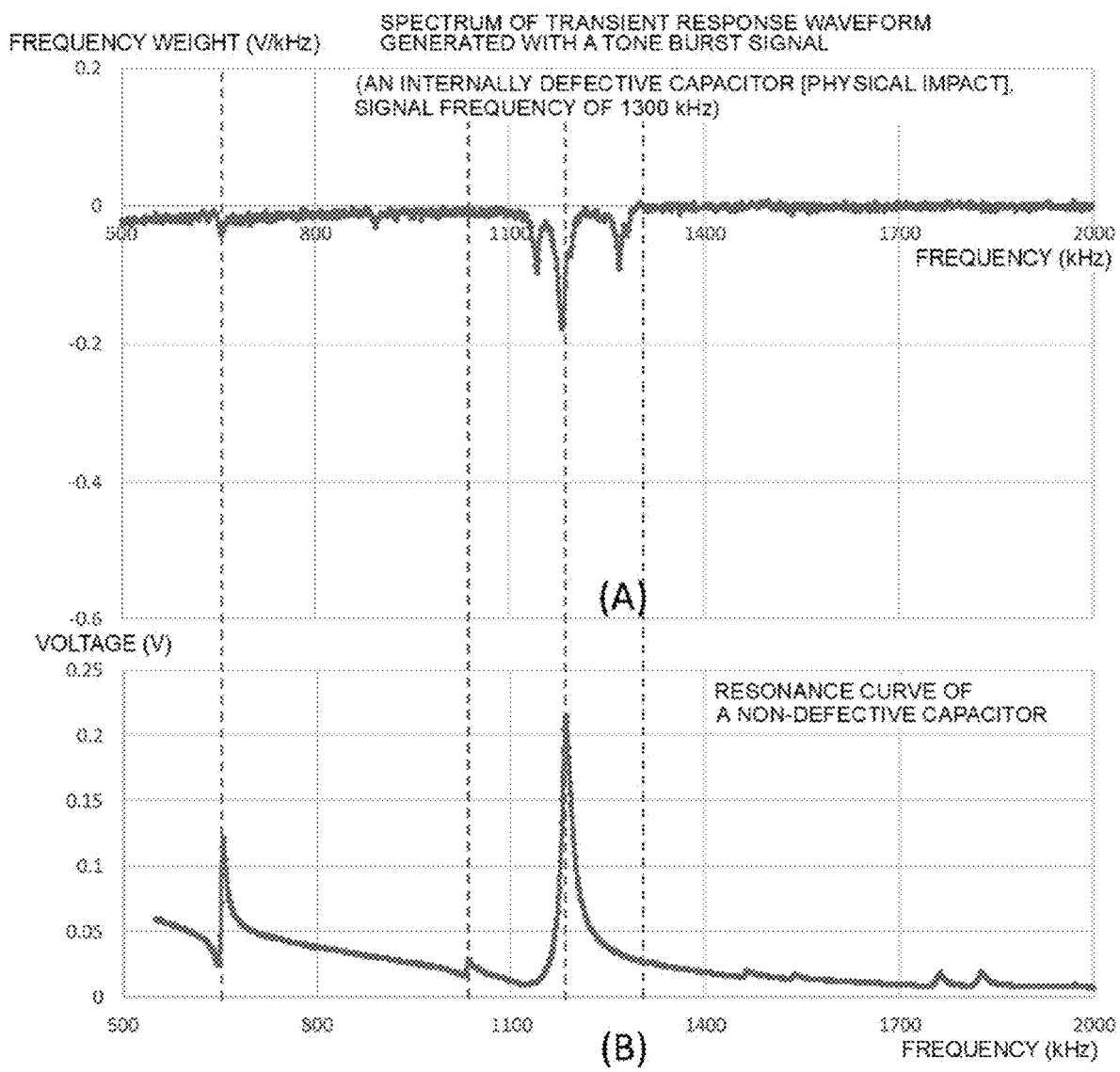
FIG. 19(A) shows a spectrum distribution for an internally defective capacitor (group III) measured in Inspection Example 2.
FIG. 19(B) shows a resonance curve of a reference non-defective capacitor measured with a step frequency sweep.

FIG. 19(A) is the spectrum distribution of an internally defective capacitor of group III (physical impact). FIG. 19(B) shows a resonance curve of a non-defective capacitor as reference. The height of the primary peak corresponding to 1190 kHz band is significantly reduced, and secondary peaks are observed.

The datasets ($f_p$, $W_p$) are constructed from transient response waveforms obtained in the above measurements where $f_p$ is the peak frequency at 1190 KHz band and Wp is the height of the corresponding peak.

Figure 20:
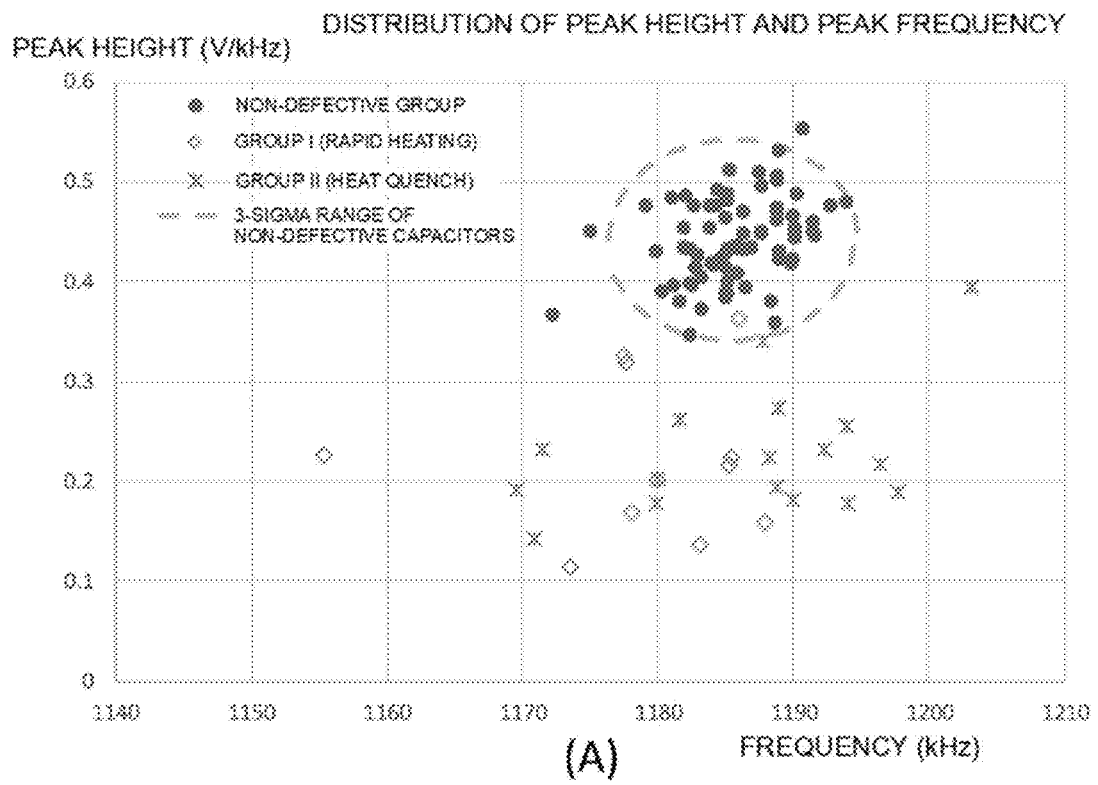
FIG. 20 is a classification plot of Inspection Example 2 with an example acceptance range. The values of peak sharpness and peak frequency found in the spectrum distributions of the non-defective capacitors and the internally defective capacitors (groups I to IV) are plotted. The dotted line in an ellipse represents a 3-sigma range of the non-defective capacitors.
Figure 20:
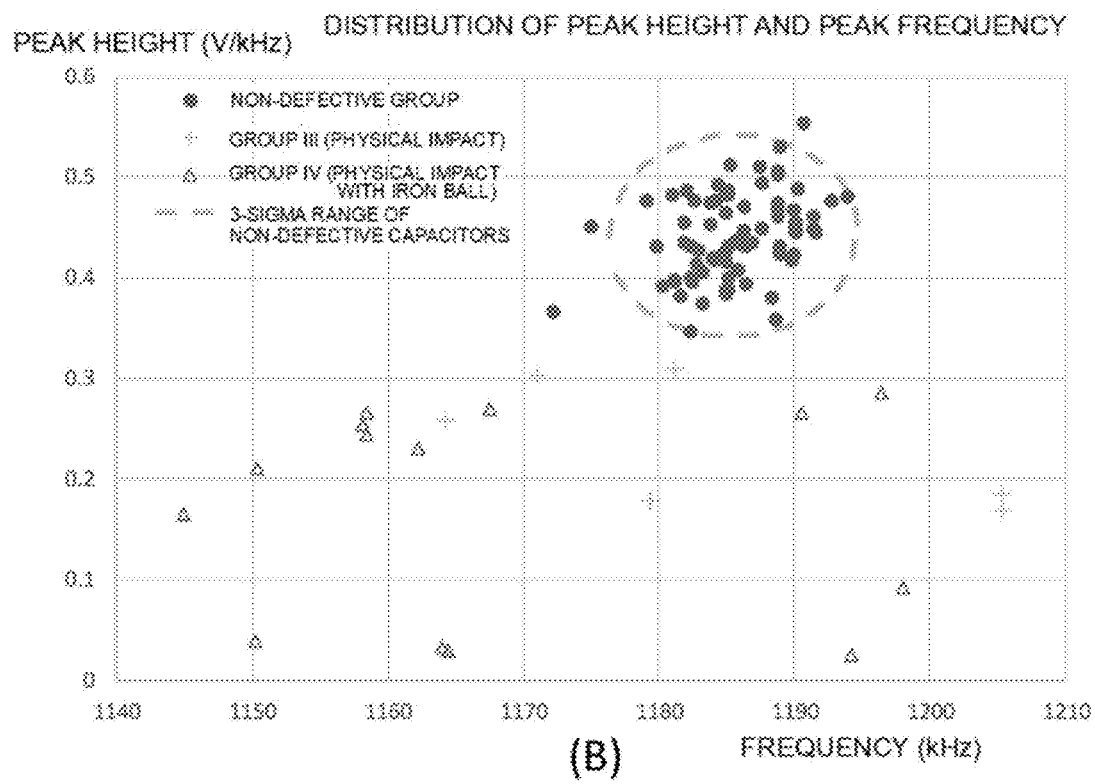

The plots of the datasets labeled in each group are shown. FIG. 20(A) plots the datasets of internally defective capacitors (group I and II) with that of non-defective capacitors. Similarly, FIG. 20(B) plots the datasets of internally defective capacitors (group III and IV) with that of non-defective capacitors. For both plots, the dotted line in ellipse represents a 3-sigma range of non-defective capacitors assuming that peak frequency and peak height are independent parameters, and both are normally distributed.

It can be observed from the plots of FIGS. 20(A) and 20(B) that peak frequency and peak height of capacitors in the non-defective group are concentrated in a narrow range of 1180 KHz to 1190 KHz and 0.35 V/KHz to 0.55 V/KHz, respectively. On the other hand, for internally defective capacitors, the peak frequencies are widely spread in both higher and lower frequency region, whereas the values peak height are significantly reduced. It is confirmed that all the internally defective capacitors except one from group I are outside the 3-sigma range.

By analyzing the spectrum distribution of the transient response waveform which is generated by switching of electric signals and extracted from a vibration response voltage, the inspection examples above validate the apparatus and the method of the present invention for high speed and high reliability identification of defective capacitors with the defined acceptance criteria.

REFERENCE SIGNS LIST

1 Capacitor
2 Holder Portion
3 DC Voltage Supply Device
4 Signal Generator
5 Bridge Load Divider
6 Filter Circuit
61 Filter Capacitor
62 Filter Resistor

The invention claimed is:

1. A capacitor inspection method comprising:
applying a direct current (DC) bias voltage to an inspection capacitor with a value which is equal to or lower than a rated value of the inspection capacitor;
inputting a first electric signal to the inspection capacitor, switching the input electric signal from the first electric signal to a second electric signal having a different waveform than the first electric signal and thereby generating a vibration containing a transient vibration in the inspection capacitor and eliciting a reaction voltage as an output from the inspection capacitor which contains a vibration response voltage generated by the vibration and the DC bias voltage; and
measuring a transient response waveform from the vibration response voltage contained in the reaction voltage.

2. The capacitor inspection method according to claim 1, further comprising determining a quality of the inspection capacitor from the transient response waveform with criteria for quality determination based on differences in transient response waveforms of non-defective capacitors and defective capacitors.

3. The capacitor inspection method according to claim 1, wherein the first electric signal of an initial input and the second electric signal for switching are applied with a load impedance adjustment to the inspection capacitor.

4. The capacitor inspection method according to claim 1, wherein a filtering process is applied in which the DC bias voltage is removed from the reaction voltage and the vibration response voltage is singled out.

5. A capacitor inspection apparatus comprising:
a holder portion for placement of an inspection capacitor;
a direct current (DC) voltage supply device that is connected to an input side of the holder portion;
a signal generator that is connected to the input side of the holder portion; and
a voltage or current measurement device that is connected to an output side of the holder portion,
wherein:
the DC voltage supply device is configured to apply a DC bias voltage to the inspection capacitor;
the signal generator is configured to input a first electric signal to the inspection capacitor, then switch the first electric signal to a second electric signal having a different waveform than the first electric signal and thereby generate a vibration containing a transient vibration in the inspection capacitor and elicit a reaction voltage as an output from the inspection capacitor which contains the DC bias voltage and a vibration response voltage generated by the vibration; and
the voltage or current measurement device is configured to measure a transient response waveform from the vibration response voltage that is contained in the reaction voltage.

6. The capacitor inspection apparatus according to claim 5, further comprising:
a bridge load divider that is connected in series between the holder portion and the signal generator; and
a filter circuit that is connected in parallel to the holder portion,
wherein:
the bridge load divider is configured to stabilize the first electric signal, the second electric signal and the output of the reaction voltage; and
the filter circuit is configured to single out the vibration response voltage by removing a DC component of the DC bias voltage from the reaction voltage.

7. The capacitor inspection apparatus according to claim 6, wherein the bridge load divider is comprised of resistors or inductors.

8. The capacitor inspection apparatus according to claim 6, wherein the filter circuit is a resistor-capacitor (RC) high-pass filter circuit comprised of capacitors and resistors.

9. The capacitor inspection apparatus according to claim 6, wherein the bridge load divider is comprised of resistors and inductors.

* * * * *